US011469669B2

(12) United States Patent
Pahkala et al.

(10) Patent No.: US 11,469,669 B2
(45) Date of Patent: Oct. 11, 2022

(54) METHODS AND CIRCUITRY TO DETECT PFM MODE ENTRY IN WIDE DUTY RANGE DC CONVERTER

(71) Applicant: Texas Instruments Incorporated, Dallas, TX (US)

(72) Inventors: Janne Matias Pahkala, Oulu (FI); Antti Juhani Korhonen, Oulu (FI)

(73) Assignee: Texas Instruments Incorporated, Dallas, TX (US)

( * ) Notice: Subject to any disclaimer, the term of this patent is extended or adjusted under 35 U.S.C. 154(b) by 157 days.

(21) Appl. No.: 16/779,259

(22) Filed: Jan. 31, 2020

(65) Prior Publication Data

US 2021/0242780 A1    Aug. 5, 2021

(51) Int. Cl.
  *H02M 3/158* (2006.01)
  *H03K 7/06* (2006.01)
  *H03K 7/08* (2006.01)
  *H02M 1/00* (2006.01)
  *H02M 3/156* (2006.01)

(52) U.S. Cl.
  CPC ............ *H02M 3/1582* (2013.01); *H03K 7/06* (2013.01); *H03K 7/08* (2013.01); *H02M 1/0032* (2021.05); *H02M 3/1566* (2021.05)

(58) Field of Classification Search
  CPC .......... H02M 1/08; H02M 1/14; H02M 1/143; H02M 3/156–1588; H02M 3/0016; H02M 3/0019
  USPC ..... 323/282–289, 299, 315, 351; 363/74, 78
  See application file for complete search history.

(56) References Cited

U.S. PATENT DOCUMENTS

| 5,770,967 A * | 6/1998 | Alzati | H03K 17/063 327/365 |
| 6,396,251 B2 * | 5/2002 | Corva | H02M 3/1563 323/283 |
| 6,396,252 B1 * | 5/2002 | Culpepper | H02M 3/156 323/284 |
| 7,307,481 B1 * | 12/2007 | Bell | H03K 3/0231 323/282 |

(Continued)

OTHER PUBLICATIONS

Texas Instruments, "TPS6594-Q1 Power Management IC (PMIC) for Processors with 5 Bucks and 4 LDOs," Dec. 2019 (357 pages).

*Primary Examiner* — Thienvu V Tran
*Assistant Examiner* — Nusrat Quddus
(74) *Attorney, Agent, or Firm* — Mark A. Valetti; Charles A. Brill; Frank D. Cimino

(57) ABSTRACT

Methods, apparatus, systems and articles of manufacture are disclosed to adjust an operating mode of a power converter. An example apparatus includes a first transistor having a gate terminal, a first current terminal, and a second current terminal, the first current terminal to be coupled to a second transistor and an inductor of a power converter, a capacitor coupled to the second current terminal, a logic gate having a first logic gate input, a second logic gate input, and a logic gate output, the logic gate output coupled to the gate terminal, a comparator having a comparator input and a comparator output, the comparator input coupled to the capacitor and the second current terminal, a multiplexer coupled to the comparator output, a first flip-flop coupled to the multiplexer and the second logic gate input, and a second flip-flop coupled to the multiplexer and the first flip-flop.

23 Claims, 9 Drawing Sheets

(56) References Cited

U.S. PATENT DOCUMENTS

| | | | | |
|---|---|---|---|---|
| 7,477,084 B2* | 1/2009 | Rice | H02M 3/1584 | 323/268 |
| 7,501,805 B2* | 3/2009 | Chen | H02M 3/156 | 323/282 |
| 7,592,791 B2* | 9/2009 | Emira | H02M 3/158 | 323/283 |
| 7,706,155 B1* | 4/2010 | Bell | H02M 3/3376 | 363/21.05 |
| 7,888,920 B2* | 2/2011 | Chen | H02M 3/158 | 323/271 |
| 7,898,235 B2* | 3/2011 | Seo | H02M 3/156 | 323/284 |
| 8,890,501 B2* | 11/2014 | Evans | H02M 3/156 | 323/284 |
| 9,007,039 B2* | 4/2015 | Kim | H02M 3/158 | 323/267 |
| 9,136,763 B2 | 9/2015 | Houston | H02M 3/158 | |
| 9,246,348 B2 | 1/2016 | Solie | H02J 7/007 | |
| 9,537,383 B1 | 1/2017 | Wibben | H02M 1/36 | |
| 9,876,429 B1 | 1/2018 | Bolus | H02M 3/156 | |
| 10,044,267 B1* | 8/2018 | Childs | H02M 3/156 | |
| 10,199,937 B1 | 2/2019 | Hauru | H02M 3/158 | |
| 10,447,142 B1 | 10/2019 | Menezes | H02M 3/1582 | |
| 10,447,145 B1* | 10/2019 | Perrin | H02M 3/1588 | |
| 10,504,769 B2 | 12/2019 | Hoyerby | H01L 21/761 | |
| 10,770,963 B2 | 9/2020 | Kazama | H02M 3/158 | |
| 10,797,598 B1 | 10/2020 | Malla | H02M 3/158 | |
| 10,845,833 B1 | 11/2020 | Dietrich | H02M 1/32 | |
| 10,965,215 B2* | 3/2021 | Talari | H02M 3/158 | |
| 10,969,808 B2* | 4/2021 | Wang | H02M 1/14 | |
| 2005/0057228 A1* | 3/2005 | Shih | H02M 3/1588 | 323/222 |
| 2005/0242858 A1* | 11/2005 | Figoli | H03K 7/08 | 327/175 |
| 2006/0055381 A1* | 3/2006 | Rice | H02M 3/285 | 323/271 |
| 2007/0002595 A1* | 1/2007 | Tzeng | H02M 1/36 | 363/49 |
| 2007/0085520 A1* | 4/2007 | Ho | H02M 3/1588 | 323/282 |
| 2007/0145961 A1* | 6/2007 | Hasegawa | H02M 1/38 | 323/282 |
| 2007/0170902 A1* | 7/2007 | Chen | H02M 3/156 | 323/282 |
| 2007/0285077 A1* | 12/2007 | Hasegawa | H02M 3/1588 | 323/351 |
| 2008/0054868 A1* | 3/2008 | Wei | H02M 1/08 | 323/282 |
| 2008/0061757 A1* | 3/2008 | Khayat | H02M 3/157 | 323/283 |
| 2008/0174286 A1* | 7/2008 | Chu | H02M 3/1588 | 323/271 |
| 2008/0198636 A1* | 8/2008 | Yang | H02M 1/14 | 363/41 |
| 2008/0278131 A1* | 11/2008 | Park | H02M 3/33515 | 323/282 |
| 2008/0315853 A1* | 12/2008 | Capilla | H02M 3/1588 | 323/288 |
| 2009/0153115 A1* | 6/2009 | Henmi | H02M 3/1582 | 323/282 |
| 2009/0261794 A1* | 10/2009 | Capilla | H02M 3/1588 | 323/283 |
| 2009/0322299 A1* | 12/2009 | Michishita | H02M 3/156 | 323/282 |
| 2010/0046250 A1* | 2/2010 | Noda | H02M 3/1588 | 363/16 |
| 2010/0066328 A1* | 3/2010 | Shimizu | H02M 3/1588 | 323/282 |
| 2010/0079127 A1* | 4/2010 | Grant | H02M 3/156 | 323/285 |
| 2010/0117686 A1* | 5/2010 | Sheahan | H02M 3/156 | 327/93 |
| 2010/0156366 A1* | 6/2010 | Sakai | H02M 3/1588 | 323/282 |
| 2010/0283442 A1* | 11/2010 | Nakashima | H02M 3/1588 | 323/283 |
| 2011/0101946 A1* | 5/2011 | Nguyen | H02M 3/158 | 323/282 |
| 2011/0148377 A1* | 6/2011 | Schiff | H02M 3/1588 | 323/283 |
| 2011/0187336 A1* | 8/2011 | Wu | G05F 1/10 | 323/282 |
| 2011/0204860 A1* | 8/2011 | Thiele | H02M 3/156 | 323/271 |
| 2011/0241633 A1* | 10/2011 | Herzer | H02M 3/1588 | 323/271 |
| 2011/0260703 A1* | 10/2011 | Laur | H02M 3/1563 | 323/271 |
| 2011/0291632 A1* | 12/2011 | Yu | H02M 3/158 | 323/283 |
| 2012/0025799 A1* | 2/2012 | Tournatory | H02M 3/156 | 323/285 |
| 2012/0119715 A1* | 5/2012 | Loikkanen | H02M 3/1582 | 323/235 |
| 2012/0126765 A1* | 5/2012 | Stone | H02M 3/1588 | 323/283 |
| 2012/0242393 A1* | 9/2012 | Chen | H03K 17/165 | 327/390 |
| 2013/0082675 A1* | 4/2013 | Capodivacca | H05B 45/39 | 323/283 |
| 2013/0294118 A1* | 11/2013 | So | H02M 3/33507 | 363/21.16 |
| 2013/0335054 A1* | 12/2013 | Pigott | H02M 3/1588 | 323/311 |
| 2014/0002047 A1* | 1/2014 | Houston | H02M 3/156 | 323/283 |
| 2014/0049240 A1* | 2/2014 | Chen | G05F 1/10 | 323/282 |
| 2014/0070779 A1* | 3/2014 | Takagi | H02M 3/1588 | 323/271 |
| 2014/0084886 A1* | 3/2014 | Causse | H02M 3/1588 | 323/282 |
| 2014/0117955 A1* | 5/2014 | Zoso | H02M 3/157 | 323/271 |
| 2015/0015220 A1* | 1/2015 | Ju | H02M 3/156 | 323/271 |
| 2015/0077081 A1* | 3/2015 | Ejury | H02M 1/088 | 323/282 |
| 2015/0091544 A1* | 4/2015 | Jayaraj | H02M 3/156 | 323/284 |
| 2015/0214827 A1* | 7/2015 | Yoon | H02M 1/14 | 323/286 |
| 2015/0280544 A1* | 10/2015 | Wang | H02M 1/32 | 323/285 |
| 2015/0282557 A1* | 10/2015 | Kirk | A43B 3/0047 | 36/31 |
| 2015/0288279 A1* | 10/2015 | Lee | H02M 3/156 | 323/282 |
| 2016/0049859 A1* | 2/2016 | de Cremoux | H02M 3/157 | 323/282 |
| 2016/0141957 A1* | 5/2016 | Ozawa | H02M 3/156 | 323/271 |
| 2016/0329734 A1* | 11/2016 | Lee | H02M 3/156 | |
| 2017/0126124 A1* | 5/2017 | Santoro | H02M 3/158 | |
| 2018/0024171 A1* | 1/2018 | Dearborn | G01R 19/0046 | 324/76.11 |
| 2018/0337599 A1* | 11/2018 | Chen | H02M 3/158 | |
| 2019/0068046 A1* | 2/2019 | Xue | H02M 1/08 | |
| 2019/0115835 A1* | 4/2019 | Cohen | H02M 1/08 | |
| 2019/0238054 A1* | 8/2019 | Flaibani | H02M 3/156 | |
| 2020/0091822 A1* | 3/2020 | Ou | H02M 1/08 | |
| 2020/0119641 A1* | 4/2020 | Liang | H02M 1/15 | |
| 2020/0127566 A1* | 4/2020 | Lazaro | H02M 1/0061 | |
| 2020/0136508 A1* | 4/2020 | Bandyopadhyay | H02M 3/158 | |
| 2020/0321871 A1* | 10/2020 | Pahkala | H03L 7/087 | |
| 2020/0382001 A1* | 12/2020 | Pahkala | H03K 5/26 | |

* cited by examiner

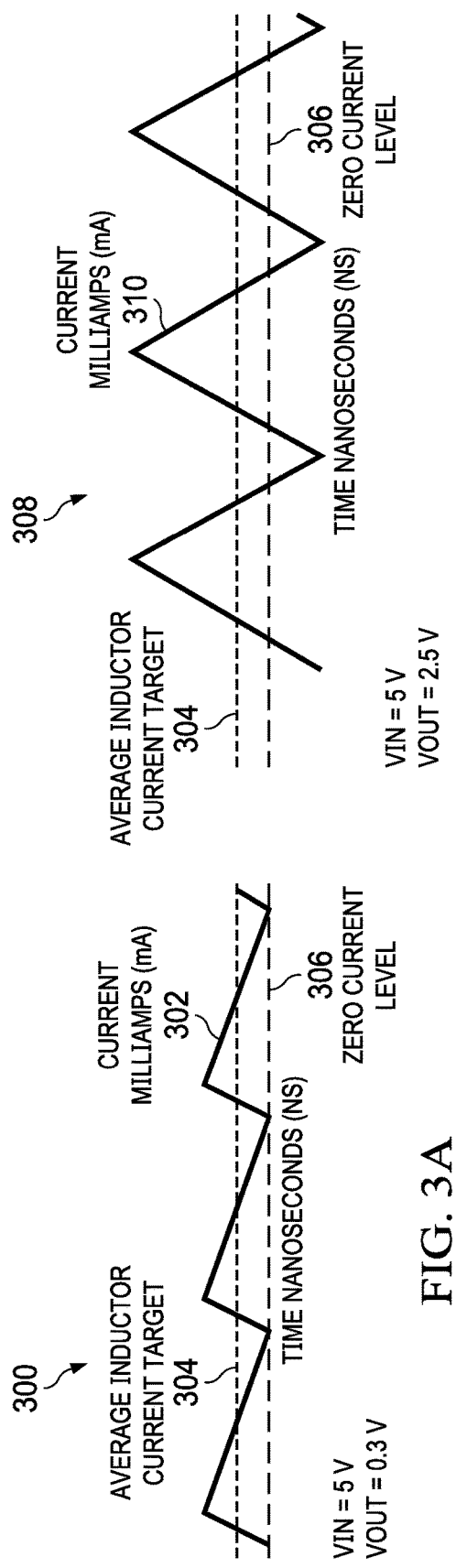
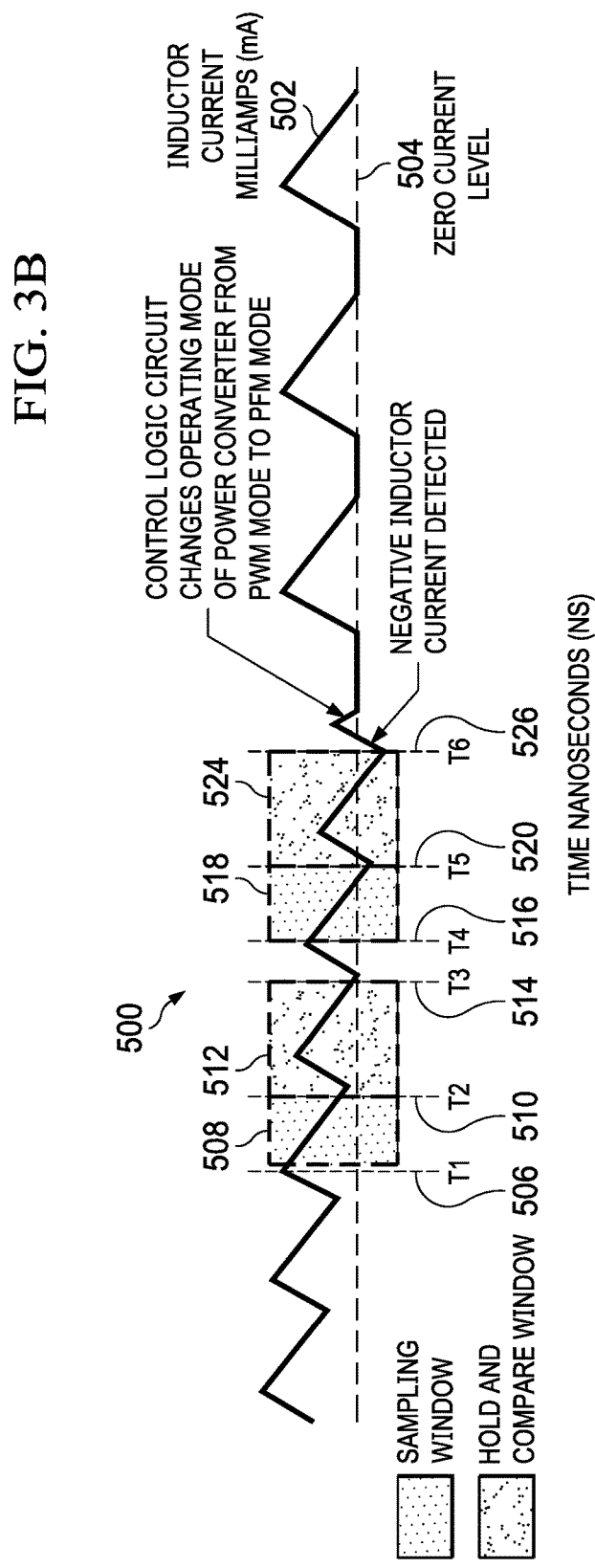

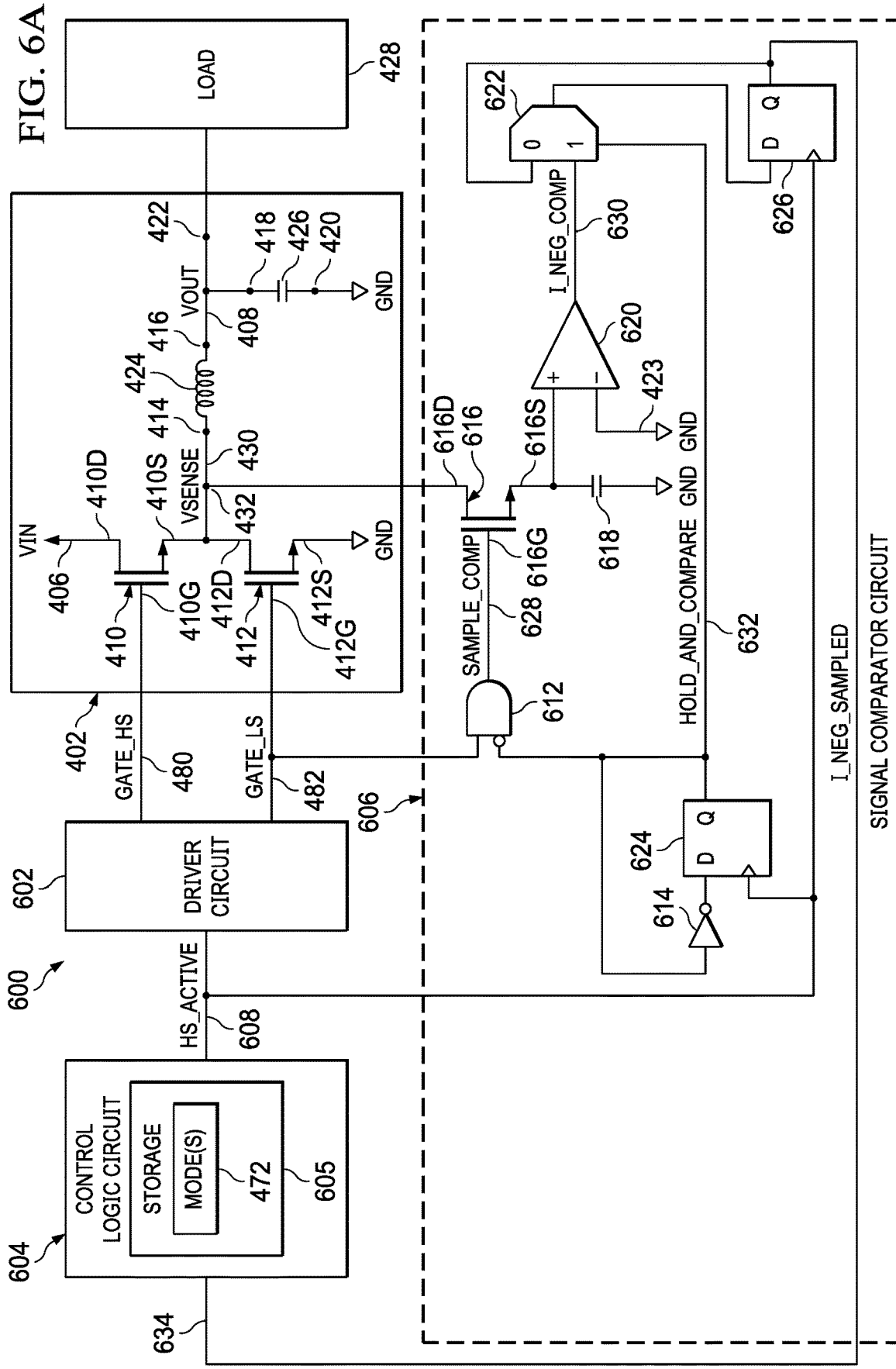

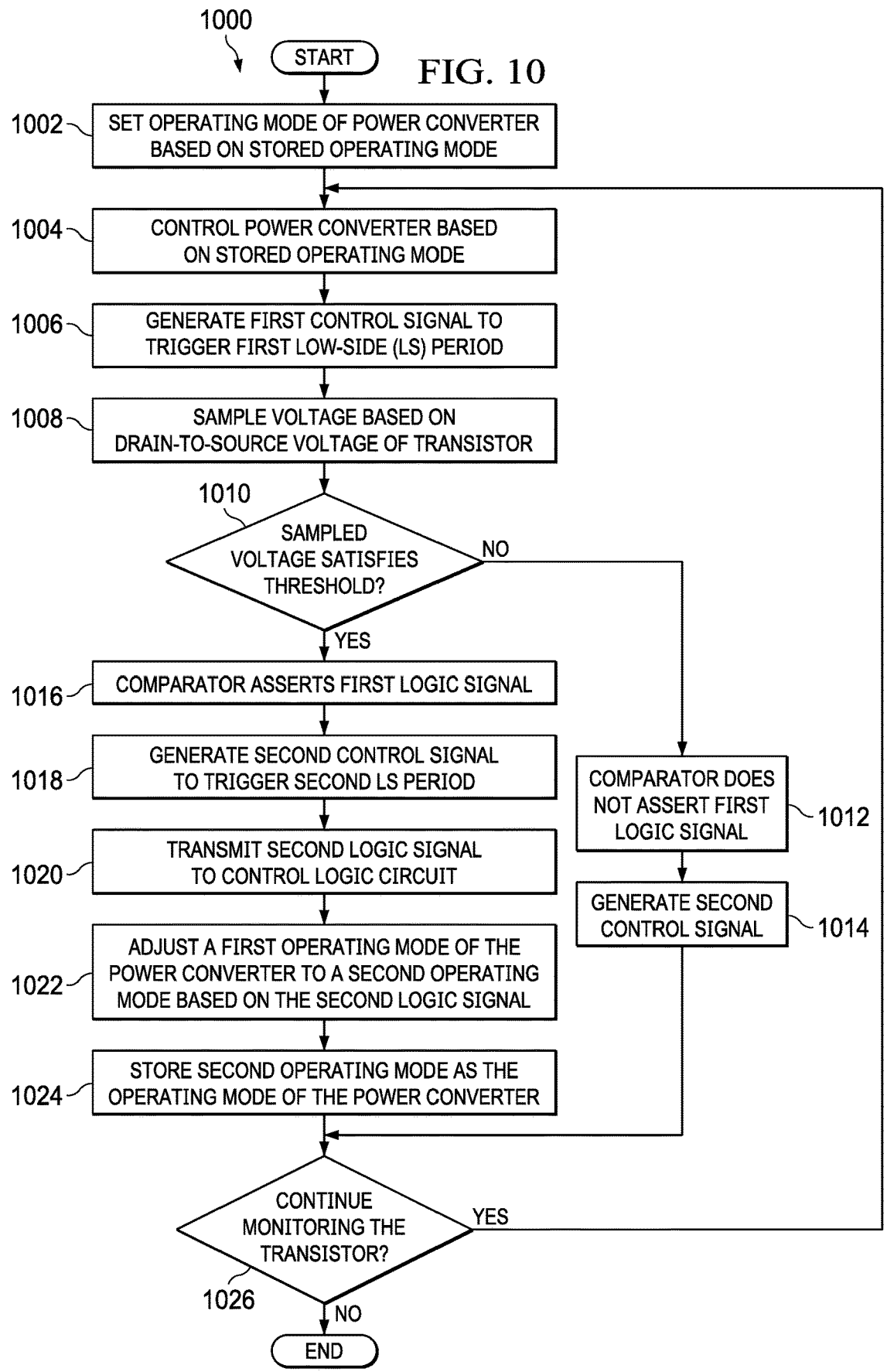

METHODS AND CIRCUITRY TO DETECT PFM MODE ENTRY IN WIDE DUTY RANGE DC CONVERTER

FIELD OF THE DISCLOSURE

This disclosure relates generally to power converters and, more particularly, to adjust an operating mode of a power converter.

BACKGROUND

Power converter circuits are used in various devices to convert input voltages to desired output voltages. For example, a buck converter converts an input voltage into a lower, desired output voltage by controlling transistors and/or switches to charge and/or discharge inductors and/or capacitors to maintain the desired output voltage. Power converters may operate in different control modes, such as a pulse-width modulation (PWM) control mode and a pulse-frequency modulation (PFM) control mode.

BRIEF DESCRIPTION OF THE DRAWINGS

FIG. 3A is a graph of example inductor current generated by a conventional power converter based on an example input voltage and a first example output voltage of the power converter.

FIG. 3B is a graph of example inductor current generated by a conventional power converter based on the example input voltage of FIG. 3A and a second example output voltage of the power converter.

FIG. 5 is an example timing diagram of example inductor current generated by the example power conversion system of FIG. 4.

FIG. 6A is a schematic illustration of another example power conversion system including the example power converter of FIG. 4 and an implementation of the example switch mode control circuit of FIG. 4.

FIG. 10 is a flowchart representative of an example process that can be carried out while utilizing example machine readable instructions that can be executed and/or example hardware configured to implement the example switch mode control circuit of FIG. 4 and/or the example control logic circuit, the example driver circuit, and/or the example signal comparator circuit of FIGS. 6A and/or 6B to adjust an operating mode of the example power converter of FIGS. 4, 6A, and/or 6B.

DETAILED DESCRIPTION

Figure 1A:
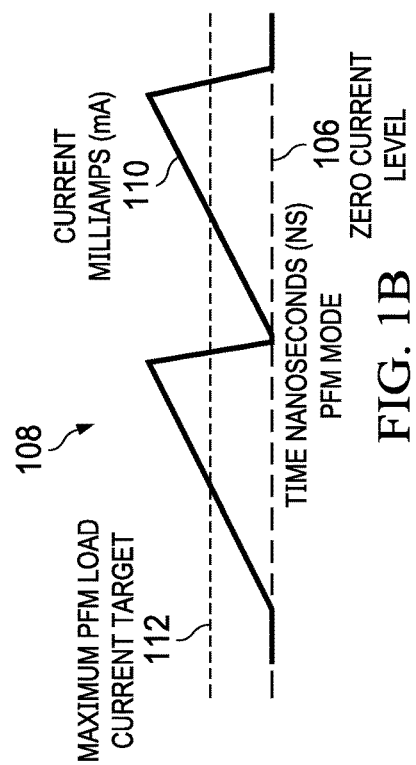
FIG. 1A is a graph of example inductor current generated in PWM mode by a conventional power converter.

The figures are not to scale. In general, the same reference numbers will be used throughout the drawing(s) and accompanying written description to refer to the same or like parts. As used herein, connection references (e.g., attached, coupled, connected, and joined) are to be construed in light of the specification and, when pertinent, the surrounding claim language. Construction of connection references in the present application shall be consistent with the claim language and the context of the specification which describes the purpose for which various elements are connected. As such, connection references do not necessarily infer that two elements are directly connected and in fixed relation to each other.

Descriptors "first," "second," "third," etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

A switched mode power supply (SMPS) is a power conversion system including one or more switched mode power converters (e.g., a boost converter, a buck converter, a buck-boost converter, etc.) to convert a first voltage (e.g., an input voltage) to a second voltage (e.g., an output voltage). A SMPS can operate in different modes (e.g., control modes, operating modes, switching modes, power converter modes (e.g., power converter control modes, power converter operating modes, power converter switching modes, etc.), etc.). Example modes include pulse-width modulation (PWM) mode and pulse-frequency modulation (PFM) mode.

In PWM mode, a driver (e.g., a gate driver) included in and/or otherwise associated with a power converter generates control signals (e.g., drive signals, pulse signals, PWM pulses, etc.) that may have a fixed frequency and a variable on/off time ratio, or duty cycle. A duty cycle can be a ratio of a first time representative of an on-time of a power switch (e.g., a power transistor) and a second time representative of a total switching period (e.g., a time period including an on period and an off period). In PWM mode, the power converter can control the output voltage by varying the duty cycle of the control signals. For instance, a power converter in PWM mode can be a direct current (DC)/DC power converter that uses a fixed-frequency oscillator to drive power switches of the power converter and transfer energy from an input to an output of the power converter. In such instances, the power converter can use control signals that are constant in frequency but vary in duty cycle. Accordingly, the power converter can control the duty cycle of the control signals to regulate the output voltage of the power converter.

In PFM mode, a driver generates control signals that have a constant or fixed duty cycle but can vary in frequency. For instance, a power converter in PFM mode can be a DC/DC power converter that generates a pulse (e.g., a PFM pulse) to drive power switches of the power converter and transfer energy from an input to an output of the power converter. In such instances, the PFM pulse is generated in response to an output voltage of the power converter dropping below a target value (e.g., a pre-defined value, a desired value, etc.) due to load current discharging an output capacitor associated with the power converter. For instance, higher load current can discharge the output capacitor faster, which can cause new PFM pulses more frequently to charge the output capacitor and, thus, a frequency of the PFM pulses can depend and/or otherwise be based on the load current. Accordingly, the power converter can control the frequency of the control signals to regulate the output voltage of the power converter.

Power converters, such as buck converters, can operate in PWM mode to optimize high-load efficiency during high-power operation. Power converters, such as buck converters, can operate in PFM mode to optimize light-load efficiency during low-power operation. For instance, PFM mode can be used in DC/DC power converters instead of PWM mode to optimize and/or otherwise increase the power converter efficiency when operating under light loads, delivering less current, etc. In such instances, the power converter can transition from PWM mode to PFM mode in response to a load-current level that is (1) high enough to maintain a desired power converter efficiency and (2) low enough to achieve a hysteresis between PFM and PWM modes.

In a conventional power converter, a size of PFM pulses can be in a range from 1.5-2.0 times larger compared to a size of a current ripple (e.g., an inductor current ripple, a PWM current ripple, etc.) when the power converter operates in PWM mode. PFM entry, or an exit from PWM mode to enter PFM mode, can be detected by sensing an average inductor current and comparing the average inductor current to a pre-defined reference inductor current value. PFM entry can occur in response to determining that one or more conditions (e.g., a load-current level) have been satisfied.

In a conventional power converter, to avoid a bounce (e.g., a mode bounce) between PWM and PFM modes, the load-current level at which the power converter enters PFM mode is less than a maximum current (e.g., a maximum load-current level) that the power converter can provide in PFM mode. For instance, the maximum load-current level at which the power converter enters PFM mode without mode bounce can occur when PFM pulses would be generated continuously. In such instances, the PFM pulses may be generated continuously with a minimum period of high-impedance state between PFM pulses. In such instances, the maximum load-current level can be 50% or less than a peak value of a PFM pulse.

In a conventional wide-duty range DC/DC power converter, a current ripple and a peak value of a PFM pulse can vary based on input and output voltages of the power converter. For instance, in a buck converter, if the input voltage is 5 volts (V) and the output voltage is 0.3 V, the current ripple is relatively small. When the current ripple is relatively small, a difference between (1) an average inductor current at PFM entry level, where the average inductor current in PWM mode can equal the load current, and (2) a maximum-load current for PFM mode is relatively small, even in instances where the PFM pulse is two times or greater than a size of the current ripple in PWM mode. Such small differences can cause mode bouncing (e.g., relatively quick and/or successive transitions between PWM and PFM modes) to occur.

In a conventional wide-duty range DC/DC power converter, in response to operating conditions, variations in measured average inductor current values and generation of reference voltages used by comparator(s) can cause relatively high variations to a load-current level used for exit from PWM mode and a corresponding entry into PFM mode. Mode bouncing can occur in response to the high variations of the load-current levels for PFM entry. Transitioning back-and-forth between PWM mode and PFM mode can cause poor and/or otherwise reduced power converter efficiency and increased output voltage ripple in response to executing a switching operation in an incorrect mode.

In some instances, using the same reference load-current level for PFM entry at different output voltages can also cause poor and/or otherwise reduced power converter efficiency in response to increases in inductor current ripple. For instance, in response to configuring a buck converter to operate with a duty ratio of 0.5, a resulting inductor current ripple can be at a maximum value, and an optimal load-current level from an efficiency perspective for PFM entry can be much higher than in an instance where the duty ratio is lower (e.g., 0.1, 0.2, etc.) or higher (e.g., 0.7, 0.8, etc.) when the inductor current ripple is relatively small and/or otherwise approaching a minimum value.

Examples disclosed herein include an example switch mode control circuit to adjust an operating mode, a switch mode, etc., of a power converter to improve efficiency of the power converter. In some disclosed examples, the switch mode control circuit reduces and/or otherwise eliminates mode bouncing between different operating modes of the power converter, such as PWM mode and PFM mode. In some disclosed examples, the switch mode control circuit samples a voltage based on a drain-to-source voltage (VDS) of a low-side (LS) transistor (e.g., a LS power transistor) of the power converter during a first LS period (e.g., towards an end of the first LS period). In some disclosed examples, the switch mode control circuit compares the sampled voltage to a threshold (e.g., a pre-defined value, a threshold voltage, a threshold voltage value, etc.) during a second LS period (e.g., towards an end of the second LS period). In some disclosed examples, the switch mode control circuit adjusts the operating mode of the power converter in response to the sampled voltage meeting and/or otherwise satisfying the threshold.

In some disclosed examples, the threshold is a voltage that is based on and/or otherwise corresponds to a negative inductor current. For example, the negative inductor current can flow from an inductor of the power converter through the LS transistor. The power converter can generate a positive VDS across the LS transistor in response to generating the negative inductor current. Advantageously, the example switch mode control circuit can determine that the power converter is generating negative inductor current based on the positive VDS being greater than a reference voltage, which can be 0 V (e.g., approximately 0 V, a voltage within a range of −0.05 V to 0.05 V, etc.).

Advantageously, the example switch mode control circuit can detect a switch condition (e.g., a power converter switch condition, a PFM entry mode condition, etc.) based on the sampled voltage meeting the threshold. In response to detecting the switch condition, the example switch mode control circuit can instruct and/or otherwise invoke the power converter to switch from PWM mode to PFM mode. Advantageously, the power converter can operate in PFM mode to improve the efficiency of the power converter during periods of light loads. In some disclosed examples, the power converter can operate in PFM mode with a reduced and/or otherwise eliminated risk of transitioning back to PWM mode. Advantageously, the example switch mode control circuit can enable monitoring of short LS periods (e.g., less than 20 ns, 40 ns, etc.) by sampling the voltage towards the end of the first LS period, which can enable support of increased switching frequencies of the power converter.

In some disclosed examples, by sampling and comparing the sampled voltage over two or more switching cycles, the example switch mode control circuit can reduce and/or otherwise eliminate inaccuracies caused by delays of comparator(s) included in and/or otherwise associated with the power converter. In such disclosed examples, the switch mode control circuit can enable a detection of negative inductor current without a relatively fast comparator where a high-side (HS) period is relatively short (e.g., less than 15 nanoseconds (ns), less than 20 ns, etc.) because of the sampling and comparing over two or more switching cycles. In some disclosed examples, by detecting the negative inductor current, the switch mode control circuit reduces and/or otherwise eliminates a generation of a load-level current reference level for use by the comparator(s).

FIG. 1A is a graph 100 of example inductor current 102 generated in PWM mode by a conventional power converter. For example, the inductor current 102 can be generated by a boost converter, a buck converter, a buck-boost converter, etc., while operating in PWM mode with respect to time. Further depicted in the example of FIG. 1A are an example target level of average inductor current 104 and an example level of zero current 106. In FIG. 1A, the target level of average inductor current 104 is a pre-determined quantity of inductor current value for PFM entry (e.g., PFM entry detection).

In the example of FIG. 1A, detecting zero-cross current (e.g., when the inductor current 102 falls below the zero current level 106) of the power converter by monitoring body diode conduction of a transistor (e.g., a LS transistor) included in the power converter is difficult in PWM mode. For example, a deadtime of the power converter is minimized (e.g., less than 1 ns, less than 2 ns, etc.) when operating in PWM mode to improve power converter efficiency at high switching frequencies.

Some power converters monitor the zero-cross current switching-cycle-to-switching-cycle by (1) sensing current through a LS transistor and (2) comparing the sensed current to the zero current level 106. In the example of FIG. 1A, inductor current slew rates are steep (e.g., 27 milliamps (mA) per nanosecond (ns) (mA/ns) based on an inductor having an inductance of 70 nanoHenries (nH) (e.g., 100 nH with −30% variation)). Accordingly, monitoring the zero-cross current during every switching cycle can be inaccurate due to the steep inductor current slew rates and delays of comparator(s) included in and/or otherwise associated with the power converter. Examples disclosed herein can improve such power converters by monitoring the zero-cross current over two or more switching cycles to enable the comparator(s) to settle and generate accurate output(s).

Figure 1B:
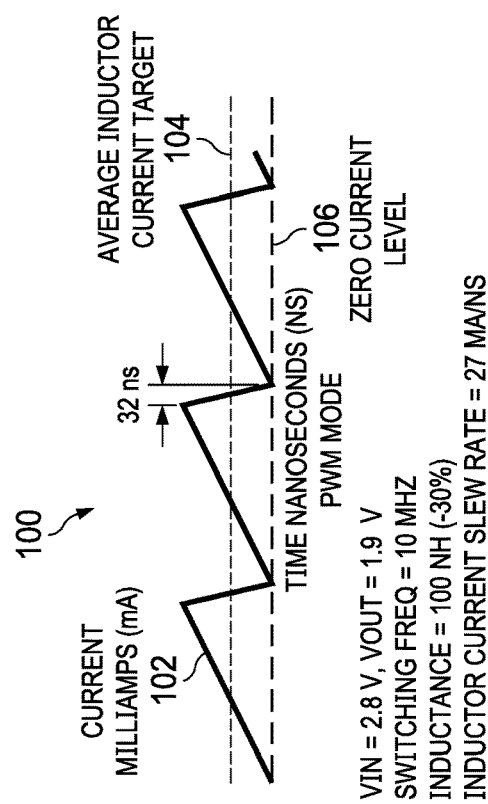
FIG. 1B is a graph of example inductor current generated in PFM mode by the conventional power converter of FIG. 1A.

FIG. 1B is a graph 108 of example inductor current 110 generated in PFM mode by the conventional power converter of FIG. 1A. For example, the inductor current 110 can be generated by a boost converter, a buck converter, a buck-boost converter, etc., while operating in PFM mode with respect to time. Further depicted in the example of FIG. 1B is an example target level of maximum PFM load current 112.

PFM entry (e.g., exiting PWM mode and entering PFM mode) for the power converter can be determined based on average inductor current being less than a maximum PFM load current target, such as the target level of maximum PFM load current 112 of FIG. 1B. For example, to ensure hysteresis between PWM and PFM modes, the average inductor current measured by the power converter is to be less than the target level of maximum PFM load current of FIG. 1B. In other examples, PFM entry may not occur in response to the average inductor current being greater than the target level of maximum PFM load current 112. For example, during a high-load condition (e.g., a high-load current being delivered to a load), power converter efficiency can be greater in PWM mode than in PFM mode. Alternatively, if the high-load condition switches to a low-load condition (e.g., a low-load current being delivered to a load), a reduction in power converter efficiency can occur in response to the power converter remaining in PWM mode (e.g., not switching to PFM mode). Examples disclosed herein can improve such power converters by determining whether to enter PFM mode over two or more switching cycles.

Figure 2A:
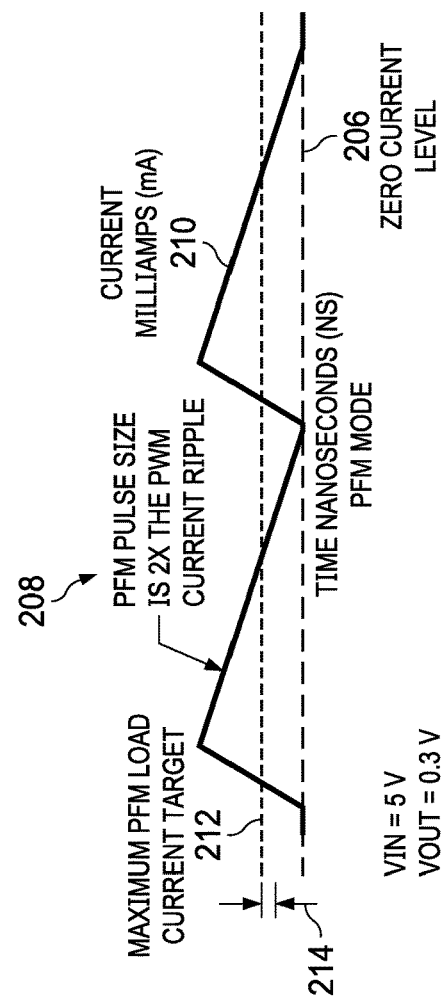
FIG. 2A is another graph of example inductor current generated in PWM mode by a conventional power converter.

FIG. 2A is another graph 200 of example inductor current 202 generated in PWM mode by a conventional power converter. In the example of FIG. 2A, monitoring PFM entry by sensing average inductor current can be too inaccurate when the inductor current ripple is small and the PFM pulse size is relative to inductor current ripple in PWM mode. For example, the maximum PFM output current can decrease in response to a decrease in the inductor current ripple. In such examples, the PFM and PWM mode hysteresis decreases in response to a decrease in PWM ripple. Accordingly, a decrease in PFM output current and the variations in PFM mode entry can cause mode bouncing to occur. Increases in PFM output current can allow for increase variation in PFM entry level. Such variations in PFM mode entry can occur in response to variations in at least one of (1) generation of a reference voltage and (2) a current sensing circuit of the conventional power converter. Further depicted in the example of FIG. 2A are an example target level of average inductor current 204 and an example zero current level 206. In the example of FIG. 2A, the target level of average inductor current 204 is a target level for PFM entry.

In the illustrated example of FIG. 2A, detection of PFM entry can be difficult in response to variations in at least one of sensing or measuring average inductor current, reference voltage generation, or comparator-related offsets caused by operating conditions (e.g., temperature, process mismatch, supply voltage, etc.). In the example of FIG. 2A, an example variation box 207 depicts time periods where the power converter can detect that a load current is below a load current target value due to the above-mentioned variations. Such variations can cause relatively high-variations to the load-current level for PFM entry. In some examples, sufficient levels of high variation can cause mode bouncing between PWM and PFM modes.

Figure 2B:
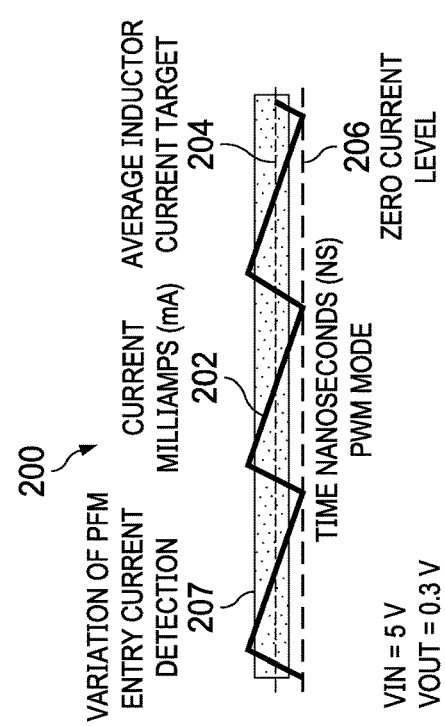
FIG. 2B is another graph of example inductor current generated in PFM mode by the conventional power converter of FIG. 2A.

FIG. 2B is another graph 208 of example inductor current 210 generated in PFM mode by the conventional power converter of FIG. 2A. Further depicted in the example of FIG. 2B are the zero current level 206 of FIG. 2A and an example target level of maximum PFM load current 212. In the example of FIG. 2B, the inductor current 210 is generated in response to the power converter generating PFM pulses having a size that is twice as large as the PWM current ripple. Although the PFM pulses are twice as large as the PWM current ripple, due to the relatively small input voltage of 5V and relatively small output voltage of 0.3 V, an example difference 214 between PFM entry current detection and the target level of maximum PFM load current 212 is also relatively small and may overlap, which can cause mode bounce in some operation conditions. In such examples, the difference 214 can cause mode bouncing between the PFM and PWM modes in response to operating conditions that can adjust the difference 214.

FIG. 3A is a graph 300 of example inductor current 302 generated by a conventional power converter based on an example input voltage (VIN) of 5.0 V and a first example output voltage (VOUT) of 0.3 V of the power converter. Further depicted in the example of FIG. 3A are an example target level of average inductor current 304 and an example level of zero current 306. In the example of FIG. 3A, the target level of average inductor current 304 is a target level for PFM entry.

FIG. 3B is a graph 308 of example inductor current 310 generated by the conventional power converter of FIG. 3A based on the input voltage of FIG. 3A and a second example output voltage (VOUT) of 2.5 V of the power converter. Further depicted in the example of FIG. 3B are the target level of average inductor current 304 and the level of zero current 306 of FIG. 3A. Using the same reference level (e.g., the same target level of average inductor current 304) for different duty ratios can cause poor and/or otherwise reduced power converter efficiency in response to generation of negative inductor current as depicted in the example of FIG. 3B.

Figure 4:
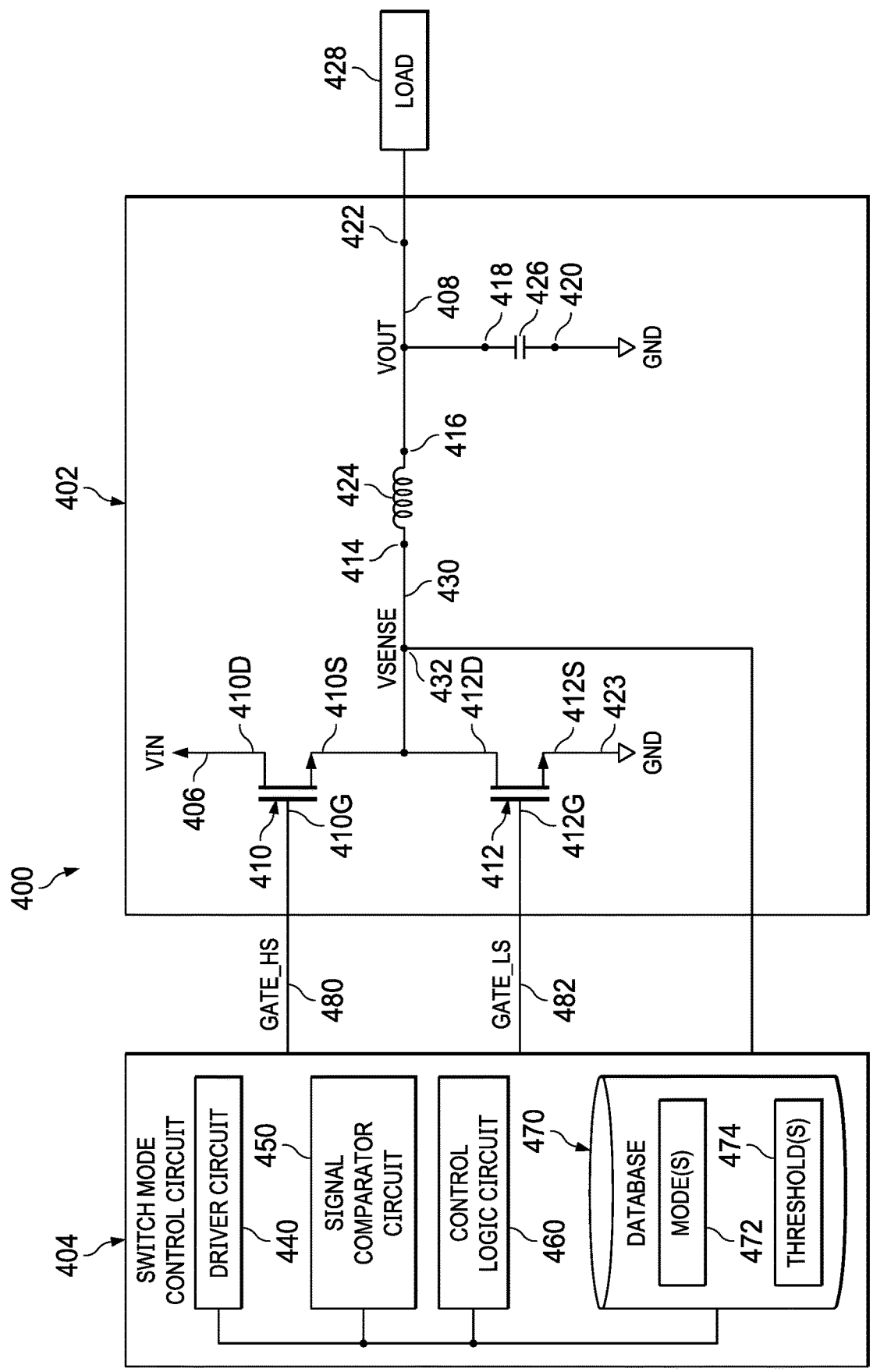
FIG. 4 is a schematic illustration of an example power conversion system including an example power converter and an example switch mode control circuit to adjust an operating mode of the power converter.

FIG. 4 is a schematic illustration of a first example power conversion system 400 including an example power converter 402 and an example switch mode control circuit 404 to adjust an operating mode of the power converter 402. In the example of FIG. 4, the power converter 402 is a buck converter (e.g., a step-down converter) that steps down an example input voltage (VIN) 406 to an example output voltage (VOUT) 408. In FIG. 4, the power converter 402 includes a first example transistor 410, a second example transistor 412, a first example inductor terminal 414, a second example inductor terminal 416, a first example capacitor terminal 418, a second example capacitor terminal 420, and an example load terminal 422.

During an example HS period, the power converter 402 can deliver and/or otherwise supply current to an example load 428 by turning on the first transistor 410 and turning off the second transistor 412. In response to turning on the first transistor 410, current can flow from the input voltage 406 to the load 428 via the first transistor 410 and the inductor 424. During the HS period, the current flowing from the input voltage 406 to the load 428 can be positive current (e.g., positive conventional current, positive inductor current, etc.).

During an example LS period, the power converter 402 can deliver and/or otherwise supply current to the load 428 by turning off the first transistor 410 and turning on the second transistor 412. In response to turning on the second transistor 412, current can flow from the inductor 424 and/or the capacitor 426 to the load 428. During the LS period, the current flowing from the inductor 424 and/or the capacitor 426 to the load 428 can be positive current. During the LS period, the current associated with the inductor 424 decreases with time and, in some examples, the current can change from positive current to negative current. For example, the current from the inductor 424 can flow to an example reference rail 423 via the second transistor 412. In such examples, the negative current flowing from the inductor 424 through the second transistor 412 can generate a drain-to-source voltage (VDS) (e.g., a positive VDS) across the current terminals 412D, 412S of the second transistor 412. In some such examples, a switch condition can be detected, identified, etc., based on the VDS of the second transistor 412 being greater than a threshold (e.g., a voltage threshold). In some such examples, the VDS can be based on and/or generated in response to the negative inductor current. Advantageously, the switch mode control circuit 404 can be configured to sample the VDS of the second transistor 412 during a first LS period and detect the switch condition during a second LS period after the first LS period.

In the illustrated example of FIG. 4, the first transistor 410 and the second transistor 412 are N-channel field-effect transistors (FETs) (e.g., N-channel power FETs). For example, the first transistor 410 and/or the second transistor 412 can be N-channel metal-oxide semiconductor FETs (MOSFETs) (e.g., N-channel power MOSFETs). In such examples, the first transistor 410 and/or the second transistor 412 can be Silicon (Si) MOSFETs (e.g., Si N-channel MOSFETs), Gallium Nitride (GaN) MOSFETs (e.g., GaN N-channel MOSFETs), Silicon Carbide (SiC) MOSFETs (e.g., SiC N-channel MOSFETS, etc.), etc. Alternatively, the first power conversion system 400 of FIG. 4 may be implemented using P-channel FETS for one or both of the transistors 410, 412.

In the illustrated example of FIG. 4, the first transistor 410 has a first example gate terminal 410G, a first example current terminal (e.g., a drain terminal, a drain current terminal, etc.) 410D, and a second example current terminal (e.g., a source terminal, a source current terminal, etc.) 410S. In the example of FIG. 4, the second transistor 412 has a second example gate terminal 412G, a third example current terminal (e.g., a drain terminal, a drain current terminal, etc.) 412D, and a fourth example current terminal (e.g., a source terminal, a source current terminal, etc.) 412S.

In the illustrated example of FIG. 4, the power converter 402 is coupled to an example inductor 424 via the first inductor terminal 414 and the second inductor terminal 416. For example, the power converter 402 can be configured to be coupled to the inductor 424 by including the first inductor terminal 414 and the second inductor terminal 416. In such examples, the first inductor terminal 414 and the second inductor terminal 416 are configured to be coupled to the inductor 424.

In the illustrated example of FIG. 4, the power converter 402 is coupled to an example capacitor 426 via the first capacitor terminal 418 and the second capacitor terminal 420. For example, the power converter 402 can be configured to be coupled to the capacitor 426 by including the first capacitor terminal 418 and the second capacitor terminal 420. In such examples, the first capacitor terminal 418 and the second capacitor terminal 420 are configured to be coupled to the capacitor 426.

In some examples, the power converter 402 is an integrated circuit (IC) that is manufactured separately from the inductor 424 and/or the capacitor 426. In such examples, after the power converter 402 is manufactured, the inductor 424 can be coupled to the power converter 402 via the inductor terminals 414, 416 and/or the capacitor 426 can be coupled to the power converter via the capacitor terminals 418, 420. In other examples, the power converter 402 can be manufactured with the inductor 424 and/or the capacitor 426 and, thus, the power converter 402 can be a single integrated circuit that includes the inductor 424 and/or the capacitor 426.

In the illustrated example of FIG. 4, the second current terminal 410S of the first transistor 410 is coupled to the third current terminal 412D of the second transistor 412. In the example of FIG. 4, the second current terminal 410S and the third current terminal 412D are coupled to the first inductor terminal 414. For example, the first transistor 410 and/or the second transistor 412 can be configured to be coupled to the inductor 424 via the first inductor terminal 414. In the example of FIG. 4, the second inductor terminal 416 is coupled to the first capacitor terminal 418 and the load terminal 422. For example, the inductor 424 can be configured to be coupled to the capacitor 426 via the first capacitor terminal and/or can be configured to be coupled to the load 428 via the load terminal 422. In the example of FIG. 4, the load 428 is an electronic control unit (ECU) of a vehicle (e.g., a vehicle having an internal combustion engine, a hybrid vehicle, an electric vehicle, etc.). In other examples, the load 428 can be one or more processors (e.g., central processing units (CPUs)) of a server (e.g., a computer server, a server executing telecommunication computing tasks, etc.) or any other computing device. For example, the load 428 can be one or more application processors, radar or other communication ICs, etc., that can be included in and/or otherwise deployed in automotive or industrial applications (e.g., robots, sensor systems, vehicles, etc.). In other examples, the load 428 can be one or more processors included in consumer electronics (e.g., Internet-enabled phones (e.g., smartphones), tables, watches (e.g., smartwatches), etc.).

In the illustrated example of FIG. 4, the first power conversion system 400 includes the switch mode control circuit 404 to sample a voltage based on an example sense voltage (VSENSE) 430 at an example node (e.g., a measurement node, a sense node, a voltage sense node, etc.) 432 and determine whether to adjust an operating mode of the power converter 402 based on the sampled voltage. In the example of FIG. 4, the sense voltage 430 can be a VDS of the second transistor 412. In some examples, the sampled voltage can be based on the VDS of the second transistor 412. In some such examples, in response to the inductor current being negative, the VDS of the second transistor 412 can be greater than zero (e.g., a positive VDS) and, thus, the sampled voltage can be greater than zero. For example, the switch mode control circuit 404 is configured to be coupled to the power converter 402 to determine whether to change the operating mode of the power converter 402 in response to detecting negative inductor current based on the sampled voltage being greater than a threshold, where the threshold can be 0 V (e.g., approximately 0 V, a voltage in a range of −0.05 V to 0.05 V, etc.).

In the example of FIG. 4, the power converter 402 can be operating in PWM mode, PFM mode, etc. In some examples, the switch mode control circuit 404 compares the sampled voltage to example threshold(s) (e.g., a pre-defined or pre-determined threshold, a voltage threshold, etc.) 474. In some examples, in response to determining that the sampled voltage meets and/or otherwise satisfies the threshold(s) 474, the switch mode control circuit 404 adjusts the operating mode of the power converter 402.

In the illustrated example of FIG. 4, the switch mode control circuit 404 is coupled to the transistors 410, 412 in a configuration to control switching operations of the transistors 410, 412. In the example of FIG. 4, the switch mode control circuit 404 is coupled to the first gate terminal 410G of the first transistor 410 and the second gate terminal 412G of the second transistor 412. In the example of FIG. 4, the switch mode control circuit 404 is coupled to the second current terminal 410S, the third current terminal 412D, and the first inductor terminal 414.

In the illustrated example of FIG. 4, the first power conversion system 400 includes, corresponds to, and/or otherwise is representative of one or more integrated circuits (e.g., integrated circuit dies), one or more integrated devices (e.g., packages, integrated circuit packages, etc.), etc., and/or a combination thereof. For example, the first power conversion system 400 can be an integrated circuit die that includes the power converter 402, the switch mode control circuit 404, the first transistor 410, and/or the second transistor 412. In other examples, the first power conversion system 400 can be an integrated circuit package including two or more integrated circuit dies. In such examples, a first integrated circuit die can include the power converter 402 and/or one(s) of the transistors 410, 412 and a second integrated circuit die can include the switch mode control circuit 404. In yet other examples, the first power conversion system 400 can include two or more integrated circuit packages. For example, the first power conversion system 400 can include a first integrated circuit package and a second integrated circuit package. The first integrated circuit package can include a first integrated circuit die that includes the power converter 402 and/or one(s) of the transistors 410, 412. The second integrated circuit package can include a second integrated circuit die that includes the switch mode control circuit 404.

In some examples, the first power conversion system 400 is one integrated device that includes the power converter 402, transistors 410, 412, and the switch mode control circuit 404. In other examples, the first power conversion system 400 can include, correspond to, and/or otherwise is representative of a first integrated device including the power converter 402, a second integrated device including the switch mode control circuit 404, and a third integrated device including one(s) of the transistors 410, 412, where the first through third integrated devices are separately manufactured and can be integrated into a single module, package, etc. In such examples, the first through third integrated devices are separate integrated devices and may not be packaged and/or otherwise assembled together prior to being received by an end user. For example, the end user can separately obtain the first through third integrated devices and arrange the first through third integrated devices as depicted in FIG. 4 after separately obtaining the integrated devices. Alternatively, the first power conversion system 400 may correspond to any other combination of one or more of the power converter 402, the switch mode control circuit 404, the first transistor 410, the second transistor 412, the inductor 424, and/or the capacitor 426 into one or more integrated circuits, one or more integrated devices, etc.

In the illustrated example of FIG. 4, the switch mode control circuit 404 includes a first example driver circuit 440, a first example signal comparator circuit 450, a first example control logic circuit 460, and an example database 470. In the example of FIG. 4, the database 470 includes example mode(s) 472 and the threshold(s) 474.

In the illustrated example of FIG. 4, the switch mode control circuit 404 includes the first driver circuit 440 to generate example control signals 480, 482 to control one(s) of the transistors 410, 412. In the example of FIG. 4, the first driver circuit 440 is configured to generate the control signals 480, 482, which include a first example control signal (GATE HS) 480 and a second example control signal (GATE LS) 482.

In the example of FIG. 4, the first driver circuit 440 is configured to control switching operations of the first transistor 410 by asserting or de-asserting the first control signal 480. For example, the first driver circuit 440 can trigger a HS period (e.g., a HS period of a switching cycle) of the power converter 402 by asserting the first control signal 480. In such examples, the assertion of the first control signal 480 can turn on and/or otherwise enable the first transistor 410, cause the first transistor 410 to conduct current, etc.

In the illustrated example of FIG. 4, the first driver circuit 440 is configured to control switching operations of the second transistor 412 by asserting or de-asserting the second control signal 482. For example, the first driver circuit 440 can trigger a LS period (e.g., a LS period of a switching cycle) of the power converter 402 by asserting the second control signal 482. In such examples, the assertion of the second control signal 482 can turn on and/or otherwise enable the second transistor 412, cause the second transistor 412 to conduct current, etc.

In the illustrated example of FIG. 4, the switch mode control circuit 404 includes the first signal comparator circuit 450 to sample the sense voltage 430 to generate a sampled voltage during a first time period (e.g., a LS period, a sampling window, a sampling time period, a sampling time interval, etc.). The first example signal comparator circuit 450 is configured to hold the sampled voltage during a second time period (e.g., a LS period, a hold window, a hold time period, a hold time interval, a hold and compare window, etc.) after the first time period. The first example signal comparator circuit 450 is configured to determine whether the sampled voltage is indicative of negative inductor current based on a comparison of the sampled voltage to the threshold(s) 474 during at least one of the first time period or the second time period.

In some examples, in response to a first rising edge of a control logic signal (e.g., a HS_ACTIVE signal), the first signal comparator circuit 450 is configured to sample the sense voltage 430 to generate a sampled voltage and assert a first logic signal in response to the sampled voltage satisfying the threshold(s) 474. In such examples, in response to a second rising edge of the control logic signal after the first rising edge of the control logic signal, the first signal comparator circuit 450 is configured to assert a second logic signal indicative of the sampled voltage corresponding to negative inductor current being generated by the power converter 402.

In the illustrated example of FIG. 4, the switch mode control circuit 404 includes the first control logic circuit 460 to generate control logic signals (e.g., HS_ACTIVE signals) to command, direct, instruct, and/or otherwise invoke the first driver circuit 440 to generate one(s) of the control signals 480, 482. In some examples, the first control logic circuit 460 is configured to adjust a first switching mode or first operating mode (e.g., PWM mode) of the power converter 402 to a second switching mode or second operating mode (e.g., PFM mode) of the power converter 402 in response to a detection of a switch condition. For example, the switch condition can be indicative of and/or otherwise correspond to the inductor current associated with the inductor 424 being negative, a current flowing through the second transistor 412 being positive, a VDS of the second transistor 412 being greater than zero, etc. In such examples, the first control logic circuit 460 is configured to detect the switch condition based on an assertion of a logic signal from the first signal comparator circuit 450. In some such examples, the first control logic circuit 460 is configured to adjust the switching mode of the power converter 402 in response to the assertion of the logic signal. For example, the first control logic circuit 460 can be configured to detect PFM entry in response to detecting and/or otherwise determining that the inductor current associated with the inductor 424 is negative.

In the illustrated example of FIG. 4, the switch mode control circuit 404 includes the database 470 to record and/or otherwise store data including the mode(s) 472, the threshold(s) 474, etc. In the example of FIG. 4, the mode(s) 472 is/are operating mode(s) of the power converter 402. For example, the mode(s) 472 can include available operating modes in which the power converter 402 can operate, where the available operating modes can include PWM mode, PFM mode, etc. In other examples, the mode(s) 472 can include an operating mode in that the power converter 402 is currently or instantly operating. For example, the mode(s) 472 can include or be PFM mode and/or otherwise be indicative or representative of the power converter 402 being in and/or otherwise operating in PFM mode. In such examples, the switch mode control circuit 404 can determine, upon start-up, triggering, and/or otherwise invoking of the first power conversion system 400, that the power converter 402 is in PFM mode based on the mode 472, by querying the mode 472 stored in the database 470. For example, one or more of the first driver circuit 440, the first signal comparator circuit 450, and/or the first control logic circuit 460 can query the database for one(s) of the mode(s) 472, the threshold(s) 474, etc. Based on the determination, the first control logic circuit 460 can invoke the first driver circuit 440 to control one(s) of the transistors 410, 412, and/or, more generally, the power converter 402 in PFM mode.

In the example of FIG. 4, the database 470 can be implemented by non-volatile memory (e.g., read-only memory (ROM), electrically erasable programmable read-only memory (EEPROM), flash memory, etc.), volatile memory (e.g., SDRAM, DRAM, etc., and/or any other type of RAM device), etc. For example, the database 470 can include one or more registers (e.g., bit registers, memory registers, etc.) that can store one or more bits (e.g., a bit sequence). In such examples, the database 470 can set one or more of the one or more bits to store one(s) of the mode(s) 472. While in the illustrated example the database 470 is illustrated as a single database, the database 470 can be implemented by any number and/or type(s) of databases. Furthermore, the data stored in the database 470 can be in any data format such as, for example, binary data, comma delimited data, tab delimited data, hexadecimal data, etc.

While an example manner of implementing the switch mode control circuit 404 is illustrated in FIG. 4, one or more of the elements, processes, and/or devices illustrated in FIG. 4 can be combined, divided, re-arranged, omitted, eliminated and/or implemented in any other way. Further, the first example driver circuit 440, the first example signal comparator circuit 450, the first example control logic circuit 460, the example database 470 and/or, more generally, the example switch mode control circuit 404 of FIG. 4 can be implemented by hardware, software, firmware and/or any combination of hardware, software and/or firmware. Thus, for example, any of the first example driver circuit 440, the first example signal comparator circuit 450, the first example control logic circuit 460, the example database 470 and/or, more generally, the example switch mode control circuit 404 could be implemented by one or more analog or digital circuit(s), hardware implemented finite state machines, logic circuits, programmable processor(s), programmable controller(s), graphics processing unit(s) (GPU(s)), digital signal processor(s) (DSP(s)), application specific integrated circuit (s) (ASIC(s)), programmable logic device(s) (PLD(s)) and/ or field programmable logic device(s) (FPLD(s)). For example, one or more of the first driver circuit 440, the first signal comparator circuit 450, the first control logic circuit 460, and/or the database 470 can correspond to one or more microcontrollers (e.g., one or more analog microcontrollers) that include analog peripherals for sensing and/or measurement functions. In such examples, one or more of the first driver circuit 440, the first signal comparator circuit 450, the first control logic circuit 460, and/or the database 470 can include one or more programmable gain amplifiers (PGAs), one or more comparators, one or more transimpedance amplifiers, one or more operational amplifiers, etc., and/or a combination thereof. In some examples, the switch mode control circuit 404 is an ECU (e.g., a vehicle ECU). In some examples, the switch mode control circuit 404 is included in the ECU.

When reading any of the apparatus or system claims of this patent to cover a purely software and/or firmware implementation, at least one of the first example driver circuit 440, the first example signal comparator circuit 450, the first example control logic circuit 460, and/or the example database 470 is/are hereby expressly defined to include a non-transitory computer readable storage device or storage disk such as non-volatile memory, volatile memory, etc., including the software and/or firmware. Further still, the example switch mode control circuit 404 of FIG. 4 can include one or more elements, processes, and/or devices in addition to, or instead of, those illustrated in FIG. 4, and/or can include more than one of any or all of the illustrated elements, processes and devices.

FIG. 5 is an example timing diagram 500 of example inductor current 502 generated by the first example power conversion system 400 of FIG. 4. Further depicted in the example of FIG. 5 is an example threshold (e.g., a current threshold, a zero current threshold, etc.) 504. In the example of FIG. 5, the threshold 504 is a level of zero current (e.g., a quantity of zero current, a zero current value, etc.). Alternatively, the threshold 504 may be any other level, value, or quantity of electrical current. In some examples, the threshold(s) 474 of FIG. 4 can include and/or otherwise store the threshold 504 of FIG. 5.

In the example timing diagram 500 of FIG. 5, at a first example time (T1) 506, a first LS period of the power converter 402 of FIG. 4 is triggered in response to the first driver circuit 440 of FIG. 4 turning on the second transistor 412 of FIG. 4. During the first LS period, the inductor current 502 decreases until the second transistor 412 is turned off and the first transistor 410 of FIG. 4 is turned on by the first driver circuit 440. In the example of FIG. 5, a first example sampling window 508 spans from relatively shortly after the first time 506 (e.g., 1 ns, 3 ns, etc., after triggering the first transistor 410) until a second example time (T2) 510, which is a relatively short time prior to the end of the first LS period (e.g., 1 ns, 3 ns, etc., prior to ending the first LS period).

At the second time 510, the first signal comparator circuit 450 of FIG. 4 samples, obtains, and/or otherwise measures the sense voltage 430 of FIG. 4 to generate a sampled voltage. For example, the sampled voltage can be based on a VDS of the second transistor 412. In such examples, the VDS of the second transistor 412 can be generated based on the inductor current 502.

At a time shortly after the second time 510, a first HS period of the power converter 402 is triggered in response to the first driver circuit 440 of FIG. 4 turning on the first transistor 410. During the first HS period, the inductor current 502 increases until the first transistor 410 is turned off and the second transistor 412 is turned on by the first driver circuit 440. In the example of FIG. 5, a second LS period of the power converter 402 is triggered in response to the first driver circuit 440 turning off the first transistor 410 and turning on the second transistor 412. In the example of FIG. 5, a first example hold and compare window 512 spans from the second time 510 or relatively shortly after the second time 510 (e.g., 1 ns, 3 ns, etc., after triggering the first HS period) until a third example time (T3) 514, which is a relatively short time prior to the end of the second LS period (e.g., 1 ns, 3 ns, etc., prior to ending the second LS period). In the example of FIG. 5, the first hold and compare window 512 spans the first HS period and the second LS period.

During the first hold and compare window 512, the first signal comparator circuit 450 determines whether the inductor current 502 meets and/or otherwise satisfies the threshold 504 based on whether the sampled voltage meets and/or otherwise satisfies a voltage threshold (e.g., the sampled voltage is greater than the voltage threshold of 0 V, approximately 0 V, etc.). In such examples, the voltage threshold can correspond to and/or otherwise be representative of negative inductor current. For example, the voltage threshold can be based on the threshold 504. In such examples, the voltage threshold can be based on a VDS of the second transistor 412 of FIG. 4, where the VDS is generated in response to current flowing through the second transistor 412. In some such examples, the threshold(s) 474 can include and/or otherwise store the voltage threshold. In the example of FIG. 5, during the first hold and compare window 512, the first signal comparator circuit 450 can determine that the sampled voltage does not indicate a negative inductor current is being generated by the power converter 402. Accordingly, the first signal comparator circuit 450 can determine that the sampled voltage does not meet and/or otherwise satisfy the voltage threshold during the second LS period.

In the example timing diagram 500 of FIG. 5, at a fourth example time (T4) 516, a third LS period of the power converter 402 is triggered in response to the first driver circuit 440 turning on the second transistor 412. In the example of FIG. 5, a second example sampling window 518 spans from relatively shortly after the fourth time 516 until a fifth example time (T5) 520, which is a relatively short time prior to the end of the third LS period.

At the fifth time 520, the first signal comparator circuit 450 of FIG. 4 samples, obtains, and/or otherwise measures the sense voltage 430 of FIG. 4 to generate a sampled voltage. At the fifth time 520, the first signal comparator circuit 450 generates the sampled voltage based on the inductor current 502, the VDS of the second transistor 412, etc.

In the example of FIG. 5, a fourth LS period of the power converter 402 is triggered after the fifth time 520 in response to the first driver circuit 440 turning off the first transistor 410 and turning on the second transistor 412. In the example of FIG. 5, a second example hold and compare window 524 spans from the fifth time 520 (e.g., immediately at the fifth time 520, substantially simultaneously as the fifth time 520, etc.) until a sixth example time (T6) 526, which is a relatively short time prior to the end of the fourth LS period. In the example of FIG. 5, the second hold and compare window 524 spans a second HS period and the fourth LS period, where the second HS period and the fourth LS period occurs after the fifth time 520.

During the second hold and compare window 524, the first signal comparator circuit 450 determines whether the inductor current 502 meets and/or otherwise satisfies the threshold 504 based on the sampled voltage satisfying the voltage threshold. In the example of FIG. 5, the first signal comparator circuit 450 can determine that the sampled voltage indicates that a negative inductor current is being generated by the power converter 402. In response to determining that the sampled voltage meets the voltage threshold, the first signal comparator circuit 450 can assert a logic signal indicative of the voltage threshold being satisfied. In response to the assertion of the logic signal, the first control logic circuit 460 can change the operating mode of the power converter 402 from a first operating mode (e.g., PWM mode) to a second operating mode (e.g., PFM mode) after the sixth time 526. In some examples, the first control logic circuit 460 stores the second operating mode (e.g., PFM mode) as the mode 472 of FIG. 4. For example, the power converter 402 and/or, more generally, the first power conversion system 400 of FIG. 4, can operate in the second operating mode after the sixth time 526 to improve an efficiency of the power converter 402.

FIG. 6A is a schematic illustration of a second example power conversion system 600 including the power converter 402, the first transistor 410, the second transistor 412, the first inductor terminal 414, the second inductor terminal 416, the first capacitor terminal 418, the second capacitor terminal 420, the load terminal 422, the inductor 424, the capacitor 426, the load 428, and the node 432 of FIG. 4. Alternatively, the second power conversion system 600 may not include the inductor 424, the capacitor 426, and/or the load 428. The first transistor 410, the second transistor 412, the first inductor terminal 414, the second inductor terminal 416, the first capacitor terminal 418, the second capacitor terminal 420, the load terminal 422, the inductor 424, the capacitor 426, the load 428, and the node 432 of FIG. 6A can be coupled together in a way that is consistent with the first transistor 410, the second transistor 412, the first inductor terminal 414, the second inductor terminal 416, the first capacitor terminal 418, the second capacitor terminal 420, the load terminal 422, the inductor 424, the capacitor 426, the load 428, and the node 432 coupled together in the example of FIG. 4.

In the illustrated example of FIG. 6A, the second power conversion system 600 can be an example implementation of the first power conversion system 400 of FIG. 4. In the example of FIG. 6A, the second power conversion system 600 includes a second example driver circuit 602, a second example control logic circuit 604, and a second example signal comparator circuit 606. In FIG. 6A, the second driver circuit 602 can be an example implementation of the first driver circuit 440 of FIG. 4. In FIG. 6A, the second control logic circuit 604 can be an example implementation of the first control logic circuit 460 of FIG. 4. In FIG. 6A, the second signal comparator circuit 606 can be an example implementation of the first signal comparator circuit 450 of FIG. 4. In FIG. 6A, the second driver circuit 602, the second control logic circuit 604, and/or the second signal comparator circuit 606 can be an example implementation of the switch mode control circuit 404 of FIG. 4.

In the illustrated example of FIG. 6A, the second power conversion system 600 includes the second driver circuit 602 to generate the control signals 480, 482 of FIG. 4 to control one(s) of the transistors 410, 412 of FIG. 4. In the example of FIG. 6A, an input (e.g., a driver circuit input) of the second driver circuit 602 is coupled to the output of the second control logic circuit 604. In the example of FIG. 6A, the second driver circuit 602 includes, corresponds to, and/or otherwise is representative of one or more non-overlap and power switch drivers. For example, the second driver circuit 602 can include and/or otherwise implement a first non-overlap and power switch driver to control the first transistor 410 and a second non-overlap and power switch driver to control the second transistor 412. In the example of FIG. 6A, a first output (e.g., a first driver circuit output) of the second driver circuit 602 is coupled to the first gate terminal 410G of the first transistor 410. In the example of FIG. 6A, a second output (e.g., a second driver circuit output) of the second driver circuit 602 is coupled to the second gate terminal 412G of the second transistor 412.

In the illustrated example of FIG. 6A, the second driver circuit 602 is configured to control switching operations of the first transistor 410 in response to an assertion of an example control logic signal (HS_ACTIVE) 608. For example, the second driver circuit 602 can be configured to trigger a HS period of the power converter 402 in response to obtaining an assertion of the control logic signal 608. In such examples, the assertion of the control logic signal 608 can command, direct, instruct, and/or otherwise invoke the second driver circuit 602 to generate the first control signal 480 to turn on and/or otherwise enable the first transistor 410, cause the first transistor 410 to conduct current, etc.

In the illustrated example of FIG. 6A, the second driver circuit 602 is configured to control switching operations of the second transistor 412 in response to a de-assertion of the control logic signal 608. For example, the second driver circuit 602 can trigger a LS period of the power converter 402 in response to a de-assertion of the control logic signal 608. In such examples, the de-assertion of the control logic signal 608 can command, direct, instruct, and/or otherwise invoke the second driver circuit 602 to turn on and/or otherwise enable the second transistor 412, cause the second transistor 412 to conduct current, etc.

In the illustrated example of FIG. 6A, the second power conversion system 600 includes the second control logic circuit 604 to generate one(s) of the control logic signal 608 to command, direct, instruct, and/or otherwise invoke the second driver circuit 602 to generate one(s) of the control signals 480, 482. In some examples, the second control logic circuit 604 is configured to adjust a first operating mode (e.g., PWM mode) of the power converter 402 to a second operating mode (e.g., PFM mode) of the power converter 402 based on a detection of a switch condition. For example, the second control logic circuit 604 can adjust and/or otherwise modify the control logic signal 608 by changing a frequency, a duty cycle, etc., based on the operating mode of the power converter 402.

In some examples, the second control logic circuit 604 is configured to generate a different control logic signal (e.g., a HIZ signal) from the control logic signal 608 when the power converter 402 is in PFM mode. For example, the second control logic circuit 604 can generate a HIZ signal in response to the first transistor 410 and the second transistor 412 being turned off between PFM pulses. In such examples, the second control logic circuit 604 can determine when to generate the HIZ signal (e.g., the second control logic circuit 604 is in HIZ mode) and can direct, instruct, and/or otherwise invoke the driver circuit 602 to generate a HIZ signal (e.g., trigger the driver circuit 602 to transition to a HIZ mode, enter a HIZ mode, operate in HIZ mode, etc.). In such examples, the second control logic circuit 604 can generate an HS_ACTIVE signal when the power converter 402 is in PWM mode and a HIZ signal when the power converter 402 is in PFM mode.

In some examples, the second control logic circuit 604 is configured to identify and/or otherwise detect the switch condition in response to and/or otherwise based on an assertion of a logic signal from the second signal comparator circuit 606. In some such examples, the second control logic circuit 604 can trigger exit from PWM mode and trigger entry into PFM mode in response to detecting and/or otherwise determining that the inductor current associated with the inductor 424 is less than zero.

In the illustrated example of FIG. 6A, the second power conversion system 600 includes the second signal comparator circuit 606 to sample the sense voltage 430 during a first time period (e.g., a LS period, a sampling window, a sampling time period, a sampling time interval, etc.) to generate a sampled voltage. In some examples, the second signal comparator circuit 606 is configured to hold the sampled voltage during a second time period (e.g., a LS period, a hold window, a hold time period, a hold time interval, a hold and compare window, etc.) after the first time period.

In some examples, the second signal comparator circuit 606 is configured to determine whether the sampled voltage is indicative of a negative inductor current based on a comparison of the sampled voltage to a threshold during at least one of the first time period or the second time period. For example, the second signal comparator circuit 606 can determine whether a voltage sampled during a first LS period is greater than the threshold during a second LS period after the first LS period.

In the example of FIG. 6A, the second signal comparator circuit 606 is configured to include a first example logic gate 612, a second example logic gate 614, a third example transistor 616, an example capacitor 618, an example comparator 620, an example multiplexer 622, a first example flip-flop 624, and a second example flip-flop 626.

In the illustrated example of FIG. 6A, the first logic gate 612 is an AND logic gate having a first logic gate input, a second logic gate input, and a first logic gate output. In FIG. 6A, the first logic gate input is configured to be a non-inverting input and the second logic gate input is configured to be an inverting input (e.g., an input that converts a logic '0' to a logic '1', a logic '1' to a logic '0', etc.). In FIG. 6A, the second logic gate 614 is an inverter having a third logic gate input and a second logic gate output.

In the illustrated example of FIG. 6A, the third transistor 616 is an N-channel FET, such as a GaN N-channel FET, a SiC N-channel FET, a Si N-channel FET, etc. For example, the third transistor 616 can be an GaN N-channel MOSET, a SiC N-channel MOSFET, a Si N-channel MOSFET, etc. Alternatively, the second signal comparator circuit 606 may be configured to use a P-channel FET (e.g., a P-channel MOSFET) for the third transistor 616. For example, the second signal comparator circuit 606 can be configured to use a P-channel GaN FET (e.g., a GaN P-channel MOSET), a P-channel SiC FET (e.g., a SiC P-channel MOSFET), a Si P-channel FET (e.g., a Si P-channel MOSFET), etc. In the example of FIG. 6A, the third transistor 616 has a third example gate terminal 616G, a fifth example current terminal (e.g., a drain terminal, a drain current terminal, etc.) 616D, and a sixth example current terminal (e.g., a source terminal, a source current terminal, etc.) 616S.

In the illustrated example of FIG. 6A, the capacitor 618 has a first terminal (e.g., a first capacitor terminal) and a second terminal (e.g., a second capacitor terminal). In FIG. 6A, the comparator 620 is a voltage comparator having a first comparator input, a second comparator input, and a comparator output. Alternatively, any other type of comparator may be used.

In the illustrated example of FIG. 6A, the multiplexer 622 has a first multiplexer input (designated with a '1'), a second multiplexer input (designated with a '0'), a selection input, and a multiplexer output. In the example of FIG. 6A, the first flip-flop 624 is a D flip-flop having a first flip-flop input (designated with a 'D'), a first clock input, and a first flip-flop output (designated with a 'Q'). In FIG. 6A, the second flip-flop 626 is a D flip-flop having a second flip-flop input (designated with a 'D'), a second clock input, and a second flip-flop output (designated with a 'Q'). Alternatively, any other type of flip-flop, latch, etc., may be used for the first flip-flop 624 and/or the second flip-flop 626.

In the illustrated example of FIG. 6A, the first logic gate 612 is coupled to the second gate terminal 412G, the second driver circuit 602, the second logic gate 614, the first flip-flop 624, and the third transistor 616 in a configuration to control a switching operation of the third transistor 616 (e.g., turn on or turn off the third transistor 616). In FIG. 6A, the first logic gate input is coupled to an output (e.g., a control logic circuit output) of the second driver circuit 602 and the second gate terminal 412G. In FIG. 6A, the second logic gate input is coupled to the third logic gate input, the first flip-flop output, and the multiplexer selection input. In FIG. 6A, the second logic gate output is coupled to the first flip-flop input. In FIG. 6A, the first logic gate output is coupled to the third gate terminal 616G. In FIG. 6A, the fifth current terminal 616D is coupled to the node 432. In FIG. 6A, the fifth current terminal 616D is coupled to the second current terminal 410S, the third current terminal 412D, the first inductor terminal 414, and/or the inductor 424. In FIG. 6A, the sixth current terminal 616S is coupled to the first capacitor terminal and the first comparator input.

In the illustrated example of FIG. 6A, the comparator 620 is coupled to the third transistor 616 and the capacitor 618 in a configuration to compare a sampled voltage to a reference voltage associated with the reference rail 423. For example, in response to turning on the third transistor 616, a small portion (e.g., a relatively small portion) of the inductor current from the inductor 424 charges the capacitor 618 (e.g., immediately charges the capacitor 618 based on a time constant of the capacitor 618 and an on-resistance (RDSON) of the third transistor 616) to a voltage that is generated across the transistor 412. In such examples, in response to turning on the third transistor 616, the capacitor 618 can be charged to the VDS of the second transistor 412. In some examples, a time constant of the capacitor 618 can be assumed to be negligible and, thus, the voltage stored by the capacitor 618 can follow the voltage across the transistor 412 (e.g., the VDS of the second transistor 412). Further depicted in the example of FIG. 6A, the second capacitor terminal and the second comparator input are coupled to the reference rail 423 of FIG. 4.

In the illustrated example of FIG. 6A, the multiplexer 622 is coupled to the comparator 620 in a configuration to select the comparison output or the second flip-flop output for transmission to the second flip-flop 626. In FIG. 6A, the comparator output is coupled to the first multiplexer input. In FIG. 6A, the second multiplexer input is coupled to the second flip-flop output an input (e.g., a control logic circuit input) of the second control logic circuit 604. In FIG. 6A, the multiplexer output is coupled to the second flip-flop input.

In FIG. 6A, the first clock input and the second clock input are coupled to an output of the second control logic circuit 604. In FIG. 6A, the second flip-flop 626 is coupled to the multiplexer 622, the first flip-flop 624, and the second control logic circuit 604 in a configuration to clock the comparator output to the second control logic circuit 604.

In the illustrated example of FIG. 6A, the first logic gate 612 asserts a first example logic signal (SAMPLE_COMP)

628 based on a logic high signal (e.g., a logic '1') at the first logic gate input and a logic low signal (e.g., a logic '0') at the second logic gate input. In FIG. 6A, in response to obtaining the logic low signal at the second logic gate input, the second logic gate input inverts the logic low signal to a logic high signal. In the example of FIG. 6A, the comparator 620 asserts a second example logic signal (I_NEG_COMP) 630 in response to a sampled voltage stored by the capacitor 618 being greater than a reference voltage. In the example of FIG. 6A, the reference voltage is a voltage of the reference rail 423. For example, the reference voltage at the second comparator input can be 0 V (e.g., substantially 0 V, a voltage in a range of −0.05 to 0.05 V, etc.). In the example of FIG. 6A, the first flip-flop output of the first flip-flop 624 outputs the third logic signal (HOLD_AND_COMPARE) 632. In the example of FIG. 6A, the second flip-flop output of the second flip-flop 626 outputs a fourth example logic signal (I_NEG_SAMPLED) 634 to an input of the second control logic circuit 604 (e.g., a control logic circuit input).

Figure 6B:
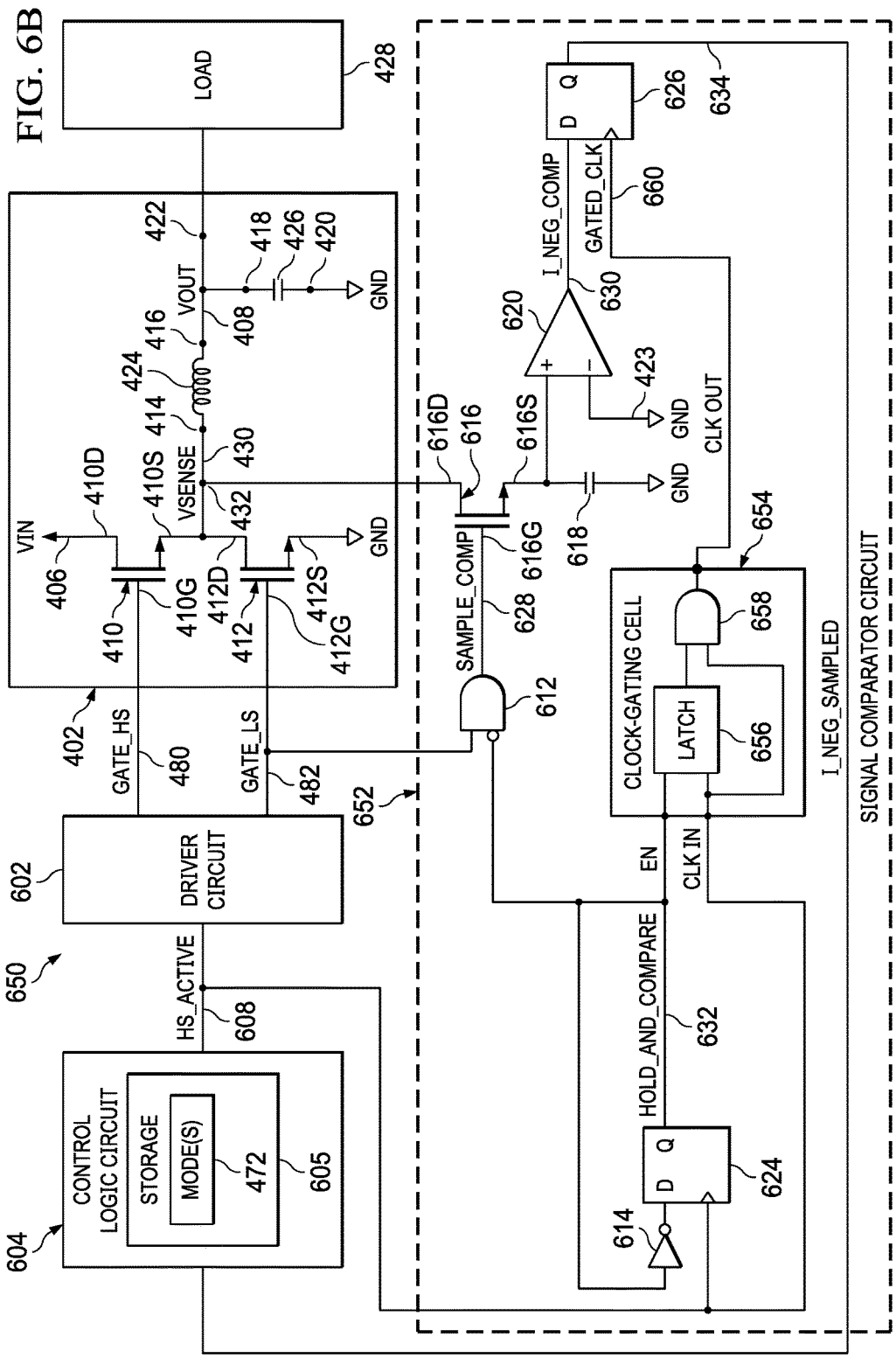
FIG. 6B is a schematic illustration of yet another example power conversion system including the example power converter of FIG. 4 and another implementation of the example switch mode control circuit of FIG. 4.

FIG. 6B is a schematic illustration of a third example power conversion system 650 including the power converter 402, the first transistor 410, the second transistor 412, the first inductor terminal 414, the second inductor terminal 416, the first capacitor terminal 418, the second capacitor terminal 420, the load terminal 422, the inductor 424, the capacitor 426, the load 428, and the node 432 of FIGS. 4 and 6A, and the driver circuit 602 and the control logic circuit 604 of FIG. 6A. Alternatively, the third power conversion system 650 may not include the inductor 424, the capacitor 426, and/or the load 428. The first transistor 410, the second transistor 412, the first inductor terminal 414, the second inductor terminal 416, the first capacitor terminal 418, the second capacitor terminal 420, the load terminal 422, the inductor 424, the capacitor 426, the load 428, the node 432, the driver circuit 602, and the control logic circuit 604 of FIG. 6B can be coupled together in a way that is consistent with the first transistor 410, the second transistor 412, the first inductor terminal 414, the second inductor terminal 416, the first capacitor terminal 418, the second capacitor terminal 420, the load terminal 422, the inductor 424, the capacitor 426, the load 428, the node 432, the driver circuit 602, and the control logic circuit 604 coupled together in the example of FIGS. 4 and/or 6A.

In the illustrated example of FIG. 6B, the third power conversion system 650 can be an example implementation of the first power conversion system 400 of FIG. 4. In the example of FIG. 6B, the third power conversion system 650 includes a third example signal comparator circuit 652. In FIG. 6B, the third signal comparator circuit 652 can be an example implementation of the first signal comparator circuit 450 of FIG. 4. In FIG. 6B, the second driver circuit 602, the second control logic circuit 604, and/or the third signal comparator circuit 652 can be an example implementation of the switch mode control circuit 404 of FIG. 4.

In the illustrated example of FIG. 6B, the third signal comparator circuit 652 includes the first logic gate 612, the second logic gate 614, the third transistor 616, the capacitor 618, the comparator 620, the first flip-flop 624, and the second flip-flop 626 of FIG. 6A. In the example of FIG. 6B, the third signal comparator circuit includes an example clock-gating cell (e.g., an integrated clock-gating cell) 654 having an enable input (EN), a clock input (CLK IN), and a clock output (CLK OUT) (e.g., a gated clock, a gated clock output, etc.). In FIG. 6B, the enable input of the clock-gated cell 654 is coupled to the first-flip flop output of the first flip-flop 624 in a configuration to obtain the third logic signal 632 of FIG. 6A. The clock input of the clock-gated cell 654 is coupled to the output of the control logic circuit 604 and the first clock input of the first flip-flop 624 in a configuration to obtain the control logic signal 608 of FIG. 6A. The clock output of the clock-gated cell 654 is coupled to the second clock input of the second flip-flop 626 in a configuration to gate the control logic signal 608 to the second clock input of the second flip-flop 626.

In the illustrated example of FIG. 6B, the clock-gating cell 654 includes an example latch 656 and a third example logic gate 658. In the illustrated example of FIG. 6B, the latch 656 is a set-reset (SR) latch. Alternatively, the latch 656 may be any other type of latch. The latch 656 has a first latch input, a second latch input, and a latch output. The first latch input is coupled to the first flip-flop output of the first flip-flop 624. For example, the first latch input can be configured to be coupled to the first flip-flop output of the first flip-flop 624 via the enable input of the of the clock-gating cell 654. The second latch input is coupled to the output of the control logic circuit 604. For example, the second latch input can be configured to be coupled to the output of the control logic circuit 604 via the clock input of the clock-gating cell 654.

In the illustrated example of FIG. 6B, the third logic gate 658 is an AND logic gate having a first AND input, a second AND input, and an AND output. Alternatively, the clock-gating cell 654 may be implemented using different logic gate(s) and/or a combination of different logic gates. The latch output is coupled to the first AND input. The second latch input and the output of the control logic circuit 604 is coupled to the second AND input. The AND output is coupled to the second clock input of the second flip-flop 626. For example, the AND output can be configured to be coupled to the second clock input of the second flip-flop 626 via the clock output of the clock-gating cell 654.

In example operation, in response to an assertion of the third logic signal 632 and a rising edge of the control logic signal 608, the third logic gate 658 passes on the control logic signal 608 without glitch as an example gated clock signal 660. In response to a de-assertion of the third logic signal 632 and/or otherwise being a logic low signal, the output of the clock-gating cell 654 is gated and, thus, no clock is outputted as the gated clock signal 660 is de-asserted.

In some examples, the latch 656, the third logic gate 658, and/or, more generally, the clock-gating cell 654, can be used to gate the clock rising edge from the second clock input of the second flip-flop 626 when the third logic signal 632 is de-asserted. For example, gating, or signal gating, can refer to masking and/or otherwise blocking unwanted signal transitions from being propagated forward in a logic circuit. In the example of FIG. 6B, the latch 656, the third logic gate 658, and/or, more generally, the clock-gating cell 654, can be used to gate the edge of the control logic signal 608 that clocks the assertion of the third logic signal 632 to the second AND input and/or, more generally, to the clock input of the clock-gating cell 654. In some such examples, the latch 656, the third logic cate 658, and/or, more generally, the clock-gating cell 654, can be used to sample the comparator output of the comparator 620 to the second flip-flop 626 in response to an assertion of the third logic signal 632 and a rising edge of the control logic signal 608.

Figure 7:
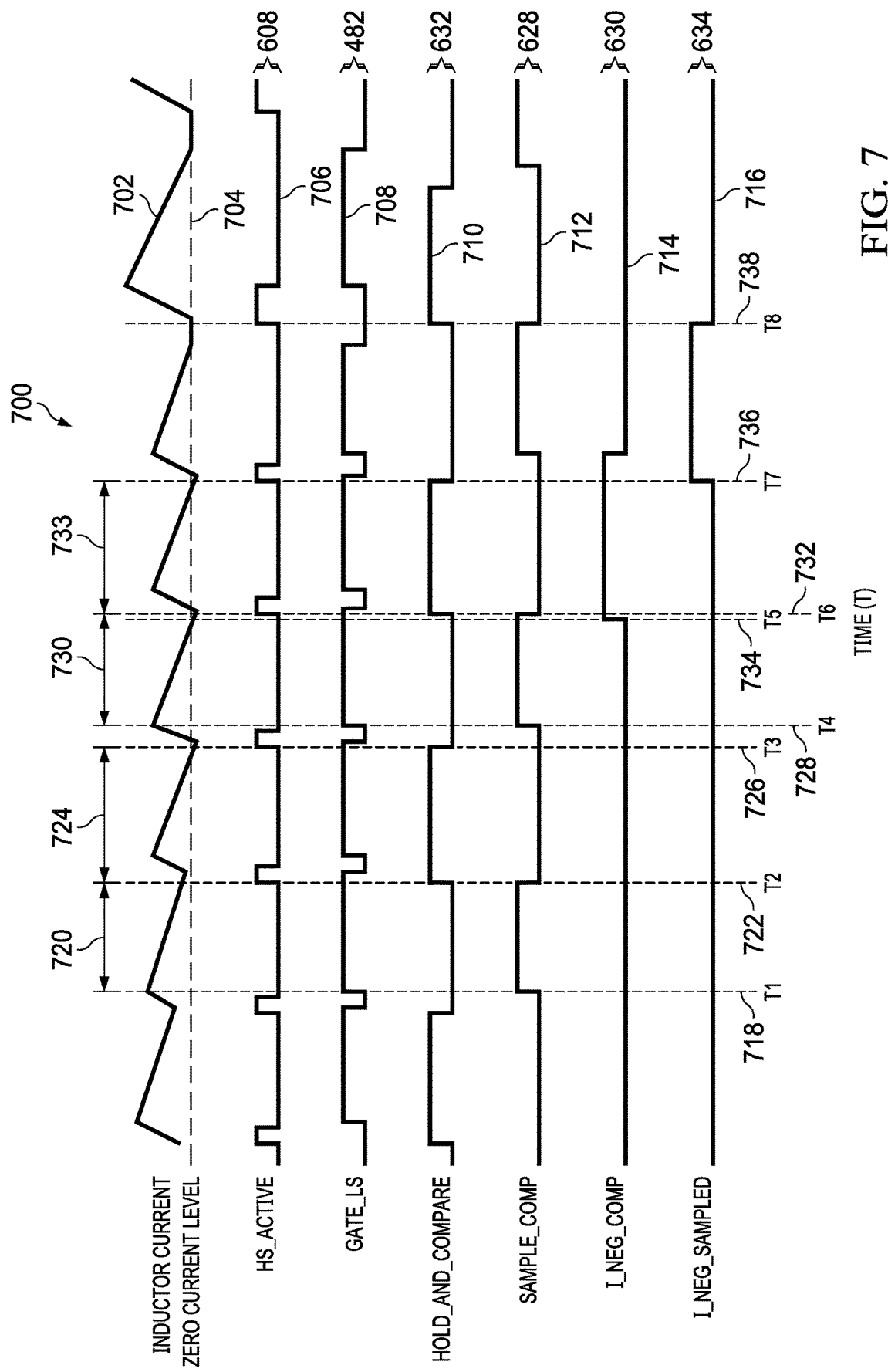
FIG. 7 is an example timing diagram depicting example operation of the example power conversion system of FIGS. 6A and/or 6B.

FIG. 7 is an example timing diagram 700 depicting example operation of the second example power conversion system 600 of FIG. 6A and/or the third example power conversion system 650 of FIG. 6B. The timing diagram 700 of the example of FIG. 7 includes an example zero current level threshold 704 and example waveforms 702, 706, 708, 710, 712, 714, 716 including a first example waveform 702, a second example waveform 706, a third example waveform 708, a fourth example waveform 710, a fifth example waveform 712, a sixth example waveform 714, and a seventh example waveform 716.

In the illustrated example of FIG. 7, the first waveform 702 is an example waveform of inductor current associated with the inductor 424 of FIGS. 4, 6A, and/or 6B. In FIG. 7, the second waveform 706 is an example waveform of the control logic signal 608 of FIGS. 6A and/or 6B. In FIG. 7, the third waveform 708 is an example waveform of the second control signal 482 of FIGS. 4, 6A, and/or 6B. In FIG. 7, the fourth waveform 710 is an example waveform of the third logic signal 632 of FIGS. 6A and/or 6B. In FIG. 7, the fifth waveform 712 is an example waveform of the first logic signal 628 of FIGS. 6A and/or 6B. In FIG. 7, the sixth waveform 714 is an example waveform of the second logic signal 630 of FIGS. 6A and/or 6B. In FIG. 7, the seventh waveform 716 is an example waveform of the fourth logic signal 634 of FIGS. 6A and/or 6B.

In the example timing diagram 700 of FIG. 7, at a first example time (T1) 718, the first transistor 410 of FIG. 4 is off (e.g., turned off in response to a falling edge of the control logic signal 608). At the first time 718, the second transistor 412 of FIG. 4 is turned on in response to a rising edge of the second control signal 482 of FIG. 4. For example, the first time 718 can correspond to a beginning or a start of a first LS period of the power converter 402 of FIGS. 4, 6A, and/or 6B.

In the example of FIG. 7, at the first time 718, the third logic signal 632 of FIGS. 6A and/or 6B is de-asserted (e.g., a logic low signal, a logic '0', etc.). At the first time 718, in response to turning on the second transistor 412, the first logic gate 612 of FIGS. 6A and/or 6B asserts the first logic signal 628 of FIGS. 6A and/or 6B. The first logic gate 612 asserts the first logic signal 628 in response to the asserted second control signal 482 at the first logic gate input and the de-asserted third logic signal 632 that is inverted to a logic high signal at the second logic gate input.

In the example timing diagram 700 of FIG. 7, the first logic gate 612 triggers and/or otherwise invokes a first example sampling window 720 that begins at the first time 718 and ends at a second example time (T2) 722. The first sampling window 720 ends in response to a rising edge of the control logic signal 608 at the second time 722. For example, prior to the second time 722, the third logic signal 632 is de-asserted, causing (1) the de-asserted third logic signal 632 to be at the third logic gate input of the second logic gate 614 of FIGS. 6A and/or 6B and (2) a logic high signal to be at the second logic gate output of the second logic gate 614 and the first flip-flop input of the first flip-flop 624 of FIGS. 6A and/or 6B. At the second time 722, in response to the rising edge of the control logic signal 608, the logic high signal at the first flip-flop input is clocked to the first flip-flop output of the first flip-flop 624 to assert the third logic signal 632. At the second time 722, in response to asserting the third logic signal 632, the second logic gate input of the first logic gate 612 inverts the asserted third logic signal 632 to a logic low signal and, thus, causes the first logic gate 612 to de-assert the first logic signal 628.

In response to asserting the first logic signal 628 at the first time 718, the first logic gate 612 turns on the third transistor 616. In response to turning on the third transistor 616, a VDS of the second transistor 412 of FIGS. 4, 6A, and/or 6B can be generated based on the inductor current, where the inductor current is associated with the inductor 424 of FIGS. 4, 6A, and/or 6B. During the first sampling window 720, the second signal comparator circuit 606 of FIGS. 6A and/or the third signal comparator circuit 652 of FIG. 6B can sample the VDS of the second transistor 412 to generate a sampled voltage and store the sampled voltage via the capacitor 618. At the second time 722, the VDS of the second transistor 412 is sampled just before the second driver circuit 602 de-asserts the second control signal 482 (e.g., 1 ns, 2 ns, 4 ns, etc., prior to turning off the second transistor 412). At the second time 722, the VDS of the second transistor 412 is sampled in response to the rising edge of the control logic signal 608.

In response to asserting the third logic signal 632 at the second time 722, a first example hold and compare window 724 is triggered to begin from the second time 722 until a third example time (T3) 726. The assertion of the third logic signal 632 maintains the sampled voltage at the capacitor 618 and invokes the multiplexer 622 to mux the second logic signal 630 to the second flip-flop input of the second flip-flop 626. For example, the first flip-flop 624 can assert the third logic signal 632 to the selection input of the multiplexer 622, causing the logic low signal at the first multiplexer input to be generated at the multiplexer output. In other examples, in response to (1) asserting the third logic signal 632 at the second time 722 and (2) a falling edge of the control logic signal 608 at a relatively short time after the second time 722, the latch 656 of FIG. 6B can assert a logic high signal to the third logic gate 658 and, thus, effectuate and/or otherwise allow the third logic gate 658 to assert the gated clock signal 660 of FIG. 6B to the second flip-flop input of the second flip-flop 626 at the third time 726.

During the first hold and compare window 724 of the example of FIG. 7, the comparator 620 of FIGS. 6A and/or 6B compares the sampled voltage (e.g., the VDS of the second transistor 412) to the reference voltage. Advantageously, the first hold and compare window 724 is generated to enable the comparator 620 to settle and/or otherwise generate a stable output and ensure the comparison executed by the comparator 620 yields an accurate and/or otherwise determinative measurement. In the example of FIG. 7, the sampled voltage obtained at the second time 722 does not meet the reference voltage at the second comparator input and, thus, is indicative of the inductor current waveform 702 being greater than the zero current level 704.

In the example timing diagram 700 of FIG. 7, the first logic gate 612 asserts the first logic signal 628 at a fourth example time (T4) 728 in response to the second control signal 482 being asserted and the third logic signal 632 being de-asserted. In response to asserting the first logic signal 628, the first logic gate 612 triggers and/or otherwise generates a second example sampling window 730 to begin at the fourth time 728 and end at a sixth example time (T6) 732. At a fifth example time (T5) 734, the comparator 620 asserts the second logic signal 630 in response to the inductor current waveform 702 being less than the zero current level 704. For example, during a second LS period beginning at the fourth time 728, the inductor current waveform 702 falls below the zero current level 704 at the fifth time 734. In such examples, the negative inductor current can cause a positive VDS to be generated across the second transistor 412. For example, in response to turning on the third transistor 616 at the fourth time 728, the capacitor 618 can charge to a voltage that matches and/or otherwise corresponds to the VDS of the second transistor 412. In some such examples, at the fifth time 734, the comparator 620 asserts the second logic signal 630 in response to the sampled voltage (e.g., the VDS of the second transistor 412) stored by the capacitor 618 being greater than the reference voltage at the second comparator input.

In the illustrated example of FIG. 7, at the sixth time 732, the first flip-flop 624 asserts the third logic signal 632 in response to a rising edge of the control logic signal 608. In response to asserting the third logic signal 632 at the sixth time 732, a second example hold and compare window 733 is triggered to begin from the sixth time 732 until a seventh example time (T7) 736. The assertion of the third logic signal 632 maintains the sampled voltage at the capacitor 618 and invokes the multiplexer 622 to mux the second logic signal 630 to the second flip-flop input of the second flip-flop 626. For example, the first flip-flop 624 can assert the third logic signal 632 to the selection input of the multiplexer 622, causing the logic high signal at the first multiplexer input to be generated at the multiplexer output. In such examples, at the sixth time 732, in response to the first flip-flop 624 clocking the asserted third logic signal 632 to the selection input of the multiplexer 622, the multiplexer 622 causes the second logic signal 630 to be at the second flip-flop input.

During the second hold and compare window 733 of the example of FIG. 7, the comparator 620 compares the sampled voltage to the reference voltage. Advantageously, the second hold and compare window 733 is generated to enable the comparator 620 to settle and/or otherwise generate a stable output and ensure the comparison executed by the comparator 620 yields an accurate and/or otherwise determinative measurement. In the example of FIG. 7, the sampled voltage obtained at the fifth time 734 meets the reference voltage at the second comparator input and, thus, is indicative of the inductor current waveform 702 being less than the zero current level 704.

At an eighth example time (T8) 738, in response to a rising edge of the control logic signal 608, the second flip-flop 626 clocks the second logic signal 630 from the multiplexer output to the second flip-flop output to assert the fourth logic signal 634. At the eighth time 738, the second control logic circuit 604 determines, identifies, and/or otherwise detects a switch condition based on the assertion of the fourth logic signal 634. In response to detecting the switch condition at the eighth time 738, the second control logic circuit 604 switches the operating mode of the power converter 402 of FIGS. 4, 6A, and/or 6B from PWM mode to PFM mode. For example, the second control logic circuit 604 can store the PFM mode as the mode 472 of FIGS. 4, 6A, and/or 6B. In such examples, the second control logic circuit 604 can set a bit in a register (e.g., a memory register, a register in memory, etc.), set a hardware and/or machine readable flag in firmware and/or software, etc., and/or a combination thereof. In response to switching the operating mode at the eighth time 738, the second control logic circuit 604, the second driver circuit 602, and/or, more generally, the switch mode control circuit 404 of FIG. 4, controls the power converter 402 and/or, more generally, the first power conversion system 400 of FIG. 4, the second power conversion system 600 of FIG. 6A, the third power conversion system 650 of FIG. 6B, etc., in PFM mode.

Figure 8:
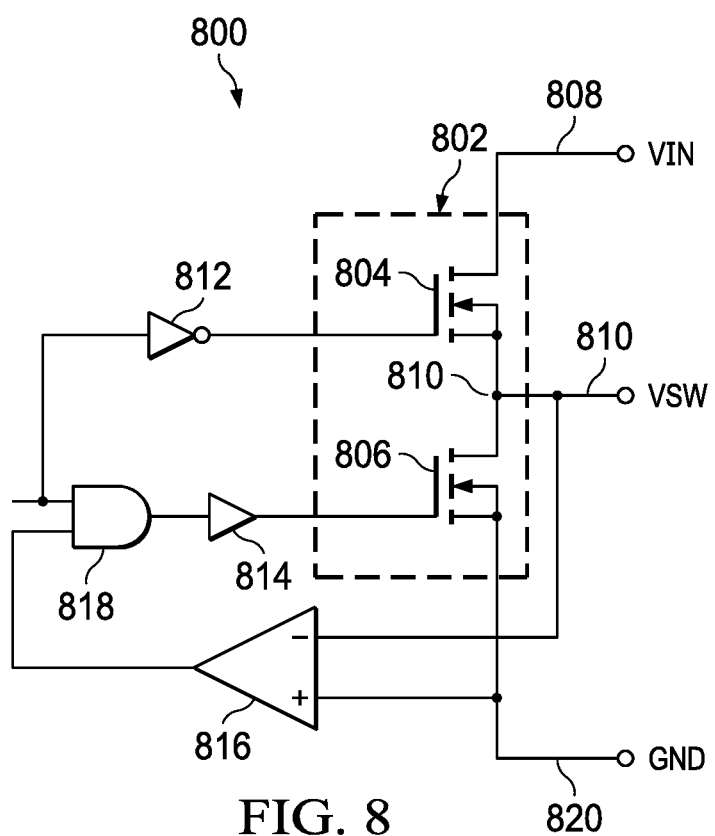
FIG. 8 is a schematic illustration of another example power conversion system including a power converter.

FIG. 8 is a schematic illustration of a fourth example power conversion system 800 that includes a power converter 802 that includes a first transistor 804 and a second transistor 806. The power converter 802 delivers current from a voltage input (VIN) 808 to an output node 810. The fourth power conversion system 800 includes a first driver (e.g., a first gate driver) 812 coupled to the first transistor 804 and a second driver 814 coupled to the second transistor 806. In FIG. 8, the fourth power conversion system 800 includes a comparator 816 and a logic gate 818.

In FIG. 8, the comparator 816 continuously compares a VDS of the second transistor 806 to a reference voltage (GND) 820. The comparator 816 is autozeroed during a HS period of the power converter 802. In some examples, in response to a steep inductor current slew rate, the power converter 802 can have reduced efficiency due to delay from the comparator 816. For example, the comparator 816 may not be fast enough to detect a positive VDS (e.g., a VDS based on negative inductor current) and, thus, cause erroneous switching operations of the power converter 802. Advantageously, the first power conversion system 400 of FIG. 4, the second power conversion system 600 of FIG. 6A, and/or the third power conversion system 650 of FIG. 6B is/are improvement(s) over the fourth power conversion system 800 of FIG. 8 because the first power conversion system 400 and/or the second power conversion system 600 can detect negative inductor current using shorter LS periods than the fourth power conversion system 800 due to reduction(s) in comparator-related delays achieved by the first power conversion system 400, the second power conversion system 600 and/or the third power conversion system 650.

Advantageously, the first power conversion system 400 of FIG. 4, the second power conversion system 600 of FIG. 6A, and/or the third power conversion system 650 of FIG. 6B is/are improvement(s) over the fourth power conversion system 800 of FIG. 8 by reducing the effects of comparator delay for zero current detection and, thus, improving efficiency of a corresponding power converter. For example, the power conversion systems 400, 600, 650 of FIGS. 4, 6A, and/or 6B sample a VDS associated with a transistor in response to a first control signal and compare the sampled VDS in response to a second control signal, where a time period between the first control signal and the second control signal enables a corresponding comparator to settle and generate an accurate output signal for detection of PFM entry.

Figure 9:
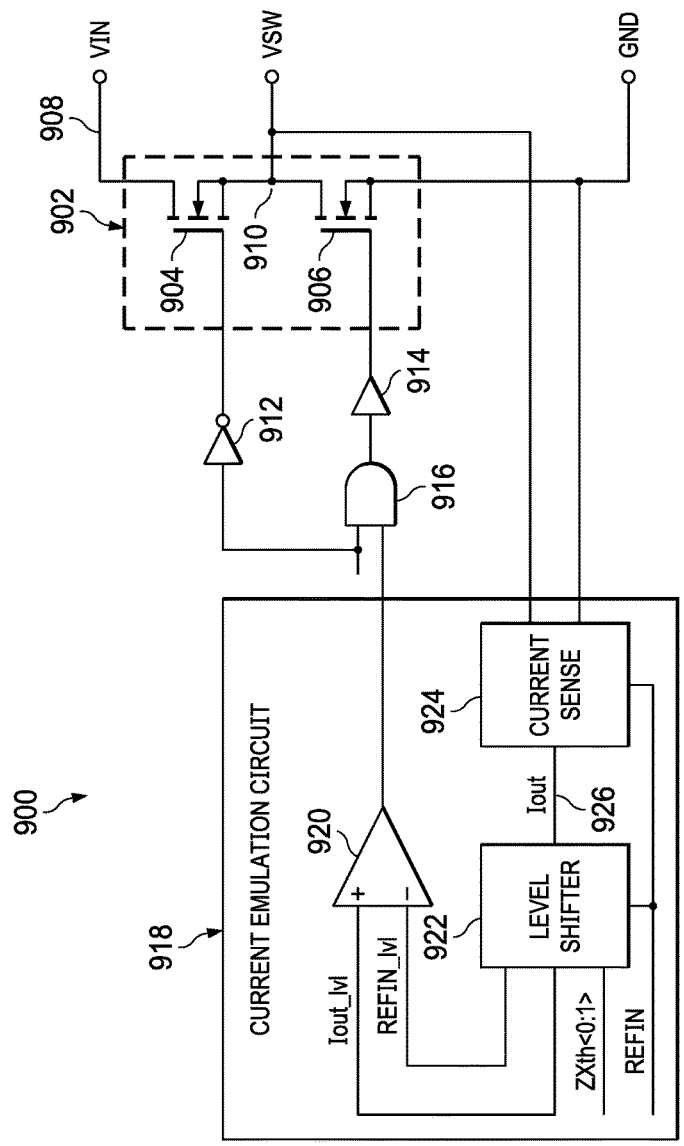
FIG. 9 is a schematic illustration of yet another example power conversion system including a power converter.

FIG. 9 is a schematic illustration of a fifth example power conversion system 900 that includes a power converter 902 that includes a first transistor 904 and a second transistor 906. The power converter 902 delivers current from a voltage input (VIN) 908 to a switch node 910. The fifth power conversion system 900 includes a first driver (e.g., a first gate driver) 912 coupled to the first transistor 904 and a second driver 914 coupled to the second transistor 906. In FIG. 9, the fifth power conversion system 900 includes a logic gate 916 and a current emulation circuit 918. The current emulation circuit 918 includes a comparator 920, a level shifter 922, and a current sense circuit 924.

In FIG. 9, the current sense circuit 924 generates IOUT 926 based on a voltage at the switch node 910. In FIG. 9, the voltage at the switch node 910 can be a VDS of the second transistor 906. The comparator 920 of the current emulation circuit 918 continuously compares the VDS of the second transistor 906 to a reference voltage (REFIN_lvl) generated by the level shifter 922. In some examples, in response to a steep inductor current slew rate, the power converter 902 can have reduced efficiency due to delay from the comparator 920. For example, the comparator 920 may not be fast enough to detect a positive VDS (e.g., a VDS based on negative inductor current) and, thus, cause erroneous switching operations of the power converter 902. Advantageously, the first power conversion system 400 of FIG. 4, the second power conversion system 600 of FIG. 6A, and/or the third power conversion system 650 of FIG. 6B is/are improvement(s) over the fifth power conversion system 900 of FIG. 9 because the first power conversion system 400 and/or the second power conversion system 600 can detect negative inductor current using shorter LS periods than the fifth power conversion system 900. For example, the detection of the negative inductor current using shorter LS periods can be in response to the reduction and/or otherwise elimination in inaccuracy of zero-current detection caused by comparator delay achieved by the first power conversion system 400 and/or the second power conversion system 600.

Advantageously, the first power conversion system 400 of FIG. 4, the second power conversion system 600 of FIG. 6A, and/or the third power conversion system 650 of FIG. 6B is/are improvement(s) over the fifth power conversion system 900 of FIG. 9 by reducing the effects of the comparator delay for zero-current detection and, thus, improving efficiency of a corresponding power converter. For example, the power conversion systems 400, 600, 650 of FIGS. 4, 6A, and/or 6B sample a VDS associated with a transistor in response to a first control signal and compare the sampled VDS in response to a second control signal, where a time period between the first control signal and the second control signal enables a corresponding comparator to settle and generate an accurate output signal for detection of PFM entry.

A flowchart representative of an example process that may be carried out while utilizing example hardware logic, example machine readable instructions (e.g., hardware readable instructions), example hardware implemented state machines, and/or any combination thereof configured to implement the first example driver circuit 440, the first example signal comparator circuit 450, the first example control logic circuit 460, the example database 470, and/or, more generally, the example switch mode control circuit 404 of FIG. 4, and/or the second example driver circuit 602, the second example control logic circuit 604, the second example signal comparator circuit 606 of FIG. 6A, and/or the third example signal comparator circuit 652 of FIG. 6B is shown in FIG. 10. The example machine readable instructions may be one or more executable programs or portion(s) of an executable program for execution by programmable processor(s), programmable controller(s), GPU(s), DSP(s), ASIC(s), PLD(s), and/or FPLD(s). The program may be embodied in software stored on a non-transitory computer readable storage medium such as a non-volatile memory, volatile memory, etc., but the entire program and/or parts thereof could alternatively be executed by any other device (e.g., programmable device) and/or embodied in firmware or dedicated hardware. Further, although the example program is described with reference to the flowchart illustrated in FIG. 10, many other methods of implementing the first example driver circuit 440, the first example signal comparator circuit 450, the first example control logic circuit 460, the example database 470, and/or, more generally, the example switch mode control circuit 404 of FIG. 4, and/or the second example driver circuit 602, the second example control logic circuit 604, the second example signal comparator circuit 606 of FIG. 6A, and/or the third example signal comparator circuit 652 of FIG. 6B may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices. The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example process of FIG. 10 may be implemented using executable instructions (e.g., computer, machine, and/or hardware readable instructions) stored on a non-transitory computer and/or machine readable medium such as a flash memory, a read-only memory, a cache, a random-access memory, and/or any other storage device or storage disk in which information is stored for any duration (e.g., for extended time periods, permanently, for brief instances, for temporarily buffering, and/or for caching of the information). As used herein, the terms non-transitory computer readable medium, non-transitory machine readable medium, and/or non-transitory hardware readable medium is/are expressly defined to include any type of computer, machine, and/or hardware readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 10 is a flowchart representative of an example process 1000 that can be carried out while utilizing example machine readable instructions that can be executed and/or example hardware configured to implement the example switch mode control circuit 404 of FIG. 4, the second example control logic circuit 604, the second example driver circuit 602, the second example signal comparator circuit 606 of FIG. 6A, and/or the third example signal comparator circuit 652 of FIG. 6B to adjust an operating mode of the example power converter 402 of FIGS. 4, 6A, and/or 6B. The example process 1000 of FIG. 10 begins at block 1002, at which the power conversion systems 400, 600, 650 of FIGS. 4, 6A, and/or 6B set an operating mode of a power converter based on a stored operating mode. For example, the first control logic circuit 460 (FIG. 4) can obtain the mode(s) 472 (FIG. 4) from the database 470 (FIG. 4). In such examples, the first control logic circuit 460 can set the mode of the power converter 402 (FIGS. 4, 6A, and/or 6B) as PWM mode. In other examples, the second control logic circuit 604 can obtain the mode(s) 472 from the storage 605 (FIGS. 6A-6B) and set the mode of the power converter 406 as PWM mode based on the obtained one of the mode(s) 472.

At block 1004, the power conversion systems 400, 600, 650 control the power converter based on the stored operating mode. For example, the first control logic circuit 460 can invoke the first driver circuit 440 (FIG. 4) to control one(s) of the transistors 410, 412 (FIG. 4) to control the power converter 402 in PWM mode. In other examples, the second control logic circuit 604 can generate the control logic signal 608 (FIGS. 6A-6B) to instruct the second driver circuit 602 (FIGS. 6A-6B) to generate one(s) of the control signals 480, 482 to control one(s) of the transistors 410, 412 to control the power converter 402 in PWM mode.

At block 1006, the power conversion systems 400, 600, 650 generate a first control signal to trigger a first low-side (LS) period. For example, the first driver circuit 440 can generate a rising edge of the second control signal 482 to turn on the second transistor 412 to trigger a first LS period. In such examples, the first control logic circuit 460 can direct the first driver circuit 440 to generate the rising edge of the second control signal 482. In other examples, in response to a falling edge of the control logic signal 608, the second driver circuit 602 can generate the rising edge of the second control signal 482 to begin a first LS period.

At block 1008, the power conversion systems 400, 600, 650 sample a voltage based on a drain-to-source voltage of a transistor. For example, the first signal comparator circuit 450 (FIG. 4) can sample a voltage based on the sense voltage 430 (FIG. 4). In such examples, the sense voltage 430 can be the VDS of the second transistor 412. In some such examples, the first signal comparator circuit 450 can sample the voltage based on the sense voltage 430 prior to a falling edge of the second control signal 482 (e.g., prior to an ending of the first LS period). In other examples, the second signal comparator circuit 606 (FIG. 6A) and/or the third signal comparator circuit 652 (FIG. 6B) can sample a voltage associated with the second transistor 412 with the capacitor 618 (FIGS. 6A-6B) prior to the falling edge of the second control signal 482. In such examples, the sampled voltage is based on the VDS of the second transistor 412.

At block 1010, the power conversion systems 400, 600, 650 determines whether the sampled voltage satisfies a threshold. For example, the first signal comparator circuit 450 can compare the sampled voltage (e.g., the VDS of the second transistor 412) to a reference voltage (e.g., 0 V, a zero-voltage threshold, etc.). In such examples, the reference voltage can be based on a quantity of zero inductor current (e.g., the zero current level 704 of FIG. 7). In some such examples, the first signal comparator circuit 450 can determine that the sampled voltage is greater than the reference voltage based on the comparison and, thus, determine that the inductor current associated with the inductor 424 is negative. In other examples, the second signal comparator circuit 606 and/or the third signal comparator circuit 652 can compare (1) the sampled voltage stored by the capacitor 618 at the first comparator input to (2) the reference voltage of the reference rail 423 (FIG. 4) at the second comparator input. In such examples, the comparator 620 (FIGS. 6A-6B) can assert the second logic signal 630 in response to the sampled voltage being greater than the reference voltage. Advantageously, the second signal comparator circuit 606 and/or the third signal comparator circuit 652 can determine that the inductor current associated with the inductor 424 is negative because the inductor current flowing through the second transistor 412 causes a positive VDS across the second transistor 412, which causes the sampled voltage stored by the capacitor 618 to be greater than the reference voltage.

If, at block 1010, the power conversion systems 400, 600, 650 determine that the sampled voltage does not satisfy the threshold, then, at block 1012, a comparator does not assert a first logic signal. For example, a comparator included in the first signal comparator circuit 450 may not assert a logic signal indicative of the sampled voltage being less than the reference voltage. In other examples, the comparator 620 may not assert the second logic signal 630 in response to the sampled voltage being less than the reference voltage.

In response to the comparator not asserting the first logic signal, then, at block 1014, the power conversion systems 400, 600, 650 generate a second control signal. For example, the first driver circuit 440 can generate a rising edge of the first control signal 480. In other examples, the second control logic circuit 604 can generate a rising edge of the control logic signal 608 to command the second driver circuit 602 to generate a rising edge of the first control signal 480. In response to generating the second control signal at block 1014, control proceeds to block 1026 to determine whether to continue monitoring the transistor.

If, at block 1010, the power conversion systems 400, 600, 650 determine that the sampled voltage satisfies the threshold, then, at block 1016, a comparator asserts a first logic signal. For example, a comparator included in the first signal comparator circuit 450 can assert a logic signal indicative of the sampled voltage being greater than the reference voltage. In other examples, the comparator 620 can assert the second logic signal 630 in response to the sampled voltage being greater than the reference voltage.

At block 1018, the power conversion systems 400, 600, 650 generate a second control signal to trigger a second LS period. For example, the first driver circuit 440 can generate a rising edge of the first control signal 480 to end a sampling window (e.g., the second sampling window 518 of FIG. 5) and begin a hold and compare window (e.g., the second hold and compare window 524 of FIG. 5). In such examples, the first driver circuit 440 can generate a rising edge of the second control signal 482 after the rising edge of the first control signal 480 to trigger a second LS period. In other examples, the second control logic circuit 604 can generate a rising edge of the control logic signal 608 to command the second driver circuit 602 to generate a rising edge of the first control signal 480 to end a sampling window (e.g., the second sampling window 730 of FIG. 7) and begin a hold and compare window (e.g., the second hold and compare window 733 of FIG. 7).

At block 1020, the power conversion systems 400, 600, 650 transmit a second logic signal to a control logic circuit. For example, the first signal comparator circuit 450 can clock a logic signal from the first signal comparator circuit 450 to the first control logic circuit 460. In other examples, the second flip-flop 626 can clock the second logic signal 630 from the multiplexer 622 (FIG. 6A) to the input of the second control logic circuit 604 to generate and/or otherwise assert the fourth logic signal 634 (FIGS. 6A-6B).

At block 1022, the power conversion systems 400, 600, 650 adjust a first operating mode of the power converter to a second operating mode based on the second logic signal. For example, the first control logic circuit 460 can adjust the operating mode from PWM mode to PFM mode based on the logic signal. In other examples, the second control logic circuit 604 can adjust the operating mode from PWM mode to PFM mode in response to the fourth logic signal 634 being asserted.

At block 1024, the power conversion systems 400, 600, 650 stores the second operating mode as the operating mode of the power converter. For example, the first control logic circuit 460 can store PFM mode as one of the mode(s) 472. In other examples, the second control logic circuit 604 can store PFM mode as one of the mode(s) 472.

At block 1026, the power conversion systems 400, 600, 650 determine whether to continue monitoring the transistor. For example, the first signal comparator circuit 450 can determine to continue monitoring a VDS associated with the second transistor 412. In other examples, the second signal comparator circuit 606 and/or the third signal comparator circuit 652 can determine whether to continue monitoring a VDS of the second transistor 412. If, at block 1026, the power conversion systems 400, 600, 650 determine to continue monitoring the transistor, control proceeds to block 1004 to control the power converter based on the stored operating mode, such as PFM mode. If, at block 1026, the power conversion systems 400, 600, 650 determine not to continue monitoring the transistor, the example process 1000 of the example of FIG. 10 concludes.

From the foregoing, it will be appreciated that example systems, methods, apparatus, and articles of manufacture have been disclosed that adjust an operating mode of a power converter. The example systems, methods, apparatus, and articles of manufacture ensure a hysteresis between PWM and PFM modes and optimize and/or otherwise improve power converter efficiency in a wide range of input and output voltages. The example systems, methods, apparatus, and articles of manufacture can optimize and/or otherwise improve power converter efficiency in power converters that include a wide range of power inductors (e.g., inductors having an inductance of 100 nH, 220 nH, 470 nH, 1 micro Henry (µH), etc.). The example systems, methods, apparatus, and articles of manufacture can improve power converter efficiency by minimizing and/or otherwise preventing disturbances to output voltages or switching operations. The example systems, methods, apparatus, and articles of manufacture improve accuracy of PFM entry detection by sampling a voltage associated with a transistor and comparing the voltage to a threshold over two or more LS periods, switching cycles, etc. The example systems, methods, apparatus, and articles of manufacture can detect PFM entry of power converters having relatively short LS periods (e.g., less than 15 ns, less than 20 ns, etc.), which can occur when operating with a low-dropout voltage or switching with a high frequency.

Example methods, apparatus, systems, and articles of manufacture to adjust an operating mode of a power converter are disclosed herein. Further examples and combinations thereof include the following:

Example 1 includes an apparatus comprising a first transistor having a gate terminal, a first current terminal, and a second current terminal, the first current terminal to be coupled to a second transistor and an inductor of a power converter, a capacitor coupled to the second current terminal, a logic gate having a first logic gate input, a second logic gate input, and a logic gate output, the logic gate output coupled to the gate terminal, a comparator having a comparator input and a comparator output, the comparator input coupled to the capacitor and the second current terminal, a multiplexer coupled to the comparator output, a first flip-flop coupled to the multiplexer and the second logic gate input, and a second flip-flop coupled to the multiplexer and the first flip-flop.

Example 2 includes the apparatus of example 1, wherein the logic gate is a first logic gate, the first flip-flop has a first flip-flop input, a second flip-flop input, and a flip-flop output, the multiplexer has a multiplexer selection input, the flip-flop output coupled to the second logic gate input and the multiplexer selection input, and further including a second logic gate having a third logic gate input and a second logic gate output, the third logic gate input coupled to the second logic gate input, the flip-flop output, and the multiplexer selection input, the second logic gate output coupled to the first flip-flop input.

Example 3 includes the apparatus of example 2, wherein the first logic gate is an AND logic gate, the first logic gate input is a non-inverted input, the second logic gate input is an inverted input, and the second logic gate is an inverter.

Example 4 includes the apparatus of example 1, wherein the multiplexer has a first multiplexer input, a second multiplexer input, a multiplexer selection input, and a multiplexer output, the second flip-flop has a first flip-flop input, a second flip-flop input, and a flip-flop output, the first flip-flop input coupled to the multiplexer output, the second flip-flop input coupled to the first flip-flop, the flip-flop output coupled to the second multiplexer input, and further including a control logic circuit having a control logic input and a control logic output, the control logic input coupled to the flip-flop output and the second multiplexer input, the control logic output coupled to the first flip-flop and the second flip-flop input.

Example 5 includes the apparatus of example 4, further including a driver circuit having a driver circuit input and a driver circuit output, the driver circuit input coupled to the control logic output, the driver circuit output coupled to the first logic gate input, the driver circuit output configured to be coupled to the second transistor.

Example 6 includes an apparatus comprising a control logic circuit configured to generate a first control signal and a second control signal, the second control signal after the first control signal, and adjust a first operating mode of a power converter to a second operating mode of the power converter in response to an assertion of a first logic signal, and a signal comparator circuit including a comparator, the signal comparator circuit coupled to the control logic circuit, the signal comparator circuit configured to in response to the first control signal, sample an input of the comparator and assert a second logic signal in response to the input satisfying a threshold, and in response to the second control signal, assert the first logic signal.

Example 7 includes the apparatus of example 6, wherein the first operating mode is a pulse-width modulation (PWM) mode and the second operating mode is a pulse-frequency modulation (PFM) mode.

Example 8 includes the apparatus of example 6, wherein the power converter includes an inductor and a first transistor having a first current terminal and a second current terminal, and the signal comparator circuit includes a second transistor having a third current terminal and a fourth current terminal, the third current terminal coupled to the first current terminal and to be coupled to the inductor, the fourth current terminal coupled to the input, the inductor to generate an inductor current, the inductor current to cause a voltage to be generated across the first current terminal and the second current terminal, a capacitor coupled to the fourth current terminal and the input, and wherein the comparator is configured to compare the voltage at the input and assert the second logic signal in response to the inductor current being less than a current threshold.

Example 9 includes the apparatus of example 6, wherein the power converter includes a first transistor having a first current terminal, the input is a comparator input, the comparator having a comparator output, and the signal comparator circuit includes a second transistor having a second current terminal and a third current terminal, the second current terminal coupled to the first current terminal, the comparator input coupled to third current terminal, a multiplexer coupled to the comparator output, a first flip-flop coupled to the multiplexer and the control logic circuit, and a second flip-flop coupled to the first flip-flop, the multiplexer, and the control logic circuit.

Example 10 includes the apparatus of example 9, wherein the control logic circuit has a control logic circuit input and a control logic circuit output, the multiplexer has a selection input, a first multiplexer input, a second multiplexer input, and a multiplexer output, the first flip-flop has a first flip-flop input, a first clock input, and a first flip-flop output, the second flip-flop has a second flip-flop input, a second clock input, and a second flip-flop output, and wherein the first multiplexer input is coupled to the comparator output, the second multiplexer input is coupled to the second flip-flop output and the control logic circuit input, the multiplexer output is coupled to the second flip-flop input, and the first clock input is coupled to the second clock input and the control logic circuit output.

Example 11 includes the apparatus of example 9, wherein the first transistor has a first gate terminal, the second transistor has a second gate terminal, the power converter further including a third transistor having a third gate terminal and a fourth current terminal, the fourth current terminal coupled to the first current terminal, and further including a control logic circuit having a control logic circuit input and a control logic circuit output, the control logic circuit input coupled to a flip-flop output of the second flip-flop, the control logic circuit output coupled to a first flip-flop input of the first flip-flop and a second flip-flop input of the second flip-flop, and a driver circuit having a driver circuit input, a first driver circuit output, and a second driver circuit output, the driver circuit input coupled to the control logic circuit output, the first driver circuit output coupled to the first gate terminal, the second driver circuit output coupled to the third gate terminal.

Example 12 includes the apparatus of example 9, wherein the first transistor has a first gate terminal, the second transistor has a second gate terminal, and the signal comparator circuit includes a first logic gate having a first logic gate input, a second logic gate input, and a first logic gate output, the first logic gate input coupled to the first gate terminal, the second logic gate input coupled to a first flip-flop output of the first flip-flop, the first logic gate output coupled to the second gate terminal, and a second logic gate having a third logic gate input and a second logic gate output, the third logic gate input coupled to the second logic gate input and the first flip-flop output, the second logic gate output coupled to a first flip-flop input of the first flip-flop.

Example 13 includes the apparatus of example 9, wherein the threshold is a first threshold, the first transistor has a first gate terminal and the second transistor has a second gate terminal, and further including a logic gate having a logic gate output coupled to the second gate terminal, the logic gate configured to assert the second logic signal in response to the first control signal, the second logic signal to turn on the second transistor, and wherein the multiplexer is configured to assert a third logic signal in response to the second logic signal being asserted and the first flip-flop asserting a fourth logic signal.

Example 14 includes a power conversion system comprising a power converter having a load terminal, the load terminal to be coupled to a load, the power converter including a transistor having a current terminal and a gate terminal, a switch mode control circuit coupled to the current terminal and the gate terminal, the switch mode control circuit including a comparator, the switch mode control circuit configured to in response to a first control signal, sample an input of the comparator, in response to the input satisfying a threshold, assert a first logic signal, in response to a second control signal after the first control signal, assert a second logic signal in response to the assertion of the first logic signal, and adjust a first operating mode of the power converter to a second operating mode of the power converter in response to the assertion of the second logic signal.

Example 15 includes the power conversion system of example 14, wherein the power converter is a buck converter, the transistor is a first transistor, the current terminal is a first current terminal coupled to the switch mode control circuit, the gate terminal is a first gate terminal coupled to the switch mode control circuit, and the power converter further including a second transistor having a second current terminal and a second gate terminal, the second current terminal coupled to the first current terminal and the switch mode control circuit, a first inductor terminal to be coupled to an inductor, the first inductor terminal coupled to the first current terminal, the second current terminal, and the switch mode control circuit, and a second inductor terminal to be coupled to the inductor and the load terminal.

Example 16 includes the power conversion system of example 14, wherein the first operating mode is a pulse-width modulation (PWM) mode and the second operating mode is a pulse-frequency modulation (PFM) mode.

Example 17 includes the power conversion system of example 14, wherein the power converter includes an inductor, the current terminal is a first current terminal, the transistor is a first transistor having a second current terminal, and the switch mode control circuit includes a second transistor having a third current terminal and a fourth current terminal, the third current terminal coupled to the first current terminal and to be coupled to the inductor, the fourth current terminal coupled to the input, the inductor to generate an inductor current, the inductor current to cause a voltage to be generated across the first current terminal and the second current terminal, and wherein the comparator is configured to compare the voltage at the input and assert the first logic signal in response to the inductor current being less than a current threshold.

Example 18 includes the power conversion system of example 14, wherein the switch mode control circuit includes a driver circuit, a signal comparator circuit, and a control logic circuit, the driver circuit coupled to the signal comparator circuit and the control logic circuit, and wherein the driver circuit is configured to turn on the transistor in response to the first control signal and the second control signal.

Example 19 includes the power conversion system of example 14, wherein the input is a comparator input, the comparator has a comparator output, the transistor is a first transistor having a first current terminal, and the switch mode control circuit includes a second transistor having a second current terminal and a third current terminal, the second current terminal coupled to the first current terminal, the comparator input coupled to third current terminal, a multiplexer coupled to the comparator output, a first flip-flop coupled to the multiplexer, a control logic circuit coupled to the first flip-flop, and a second flip-flop coupled to the first flip-flop, the multiplexer, and the control logic circuit.

Example 20 includes the power conversion system of example 19, wherein the control logic circuit has a control logic circuit input and a control logic circuit output, the multiplexer has a selection input, a first multiplexer input, a second multiplexer input, and a multiplexer output, the first flip-flop has a first flip-flop input, a first clock input, and a first flip-flop output, the second flip-flop has a second flip-flop input, a second clock input, and a second flip-flop output, and wherein the first multiplexer input is coupled to the comparator output, the second multiplexer input is coupled to the second flip-flop output and the control logic circuit input, the multiplexer output is coupled to the second flip-flop input, and the first clock input is coupled to the second clock input and the control logic circuit output.

Example 21 includes the power conversion system of example 19, wherein the first transistor has a first gate terminal, the second transistor has a second gate terminal, and the switch mode control circuit includes a first logic gate having a first logic gate input, a second logic gate input, and a first logic gate output, the first logic gate input coupled to the first gate terminal, the second logic gate input coupled to a first flip-flop output of the first flip-flop, the first logic gate output coupled to the second gate terminal, and a second logic gate having a third logic gate input and a second logic gate output, the third logic gate input coupled to the second logic gate input and the first flip-flop output, the second logic gate output coupled to a first flip-flop input of the first flip-flop.

Example 22 includes the power conversion system of example 19, wherein the threshold is a first threshold, the first transistor has a first gate terminal and the second transistor has a second gate terminal, and further including a logic gate having a first logic gate input, a second logic gate input, and a logic gate output, the first logic gate input coupled to the first gate terminal, the second logic gate input coupled to a first flip-flop output of the first flip-flop, the logic gate output coupled to the second gate terminal, the logic gate configured to assert a third logic signal in response to a fourth logic signal being asserted and a fifth logic signal being de-asserted, the third logic signal to turn on the second transistor, and wherein the multiplexer is configured to assert a sixth logic signal in response to the first logic signal being asserted and the first flip-flop asserting the fifth logic signal.

Example 23 includes a method comprising in response to a first control signal, sampling an input of a comparator during a first low-side period, the input based on a voltage associated with a transistor coupled to a power converter, in response to the input satisfying a threshold, asserting a first logic signal, in response to a second control signal after the first control signal, selecting, with a multiplexer, the first logic signal to be transmitted to a flip-flop during a second low-side period after the first low-side period, asserting, with the flip-flop, a second logic signal based on the first logic signal, and adjusting a first operating mode of the power converter to a second operating mode of the power converter in response to the assertion of the second logic signal.

Example 24 includes the method of example 23, wherein the transistor is a first transistor, and further including in response to turning on the first transistor during the first low-side period, asserting, with a logic gate coupled to the first transistor, a third logic signal to turn on a second transistor, the second transistor coupled to the first transistor and the logic gate, in response to the assertion of the third logic signal and the input satisfying the threshold, asserting, with the comparator coupled to the second transistor, the first logic signal, in response to the assertion of the first logic signal, asserting, with the multiplexer coupled to the comparator, a fourth logic signal to the flip-flop coupled to the multiplexer, and in response to the second control signal, asserting, with the flip-flop, the second logic signal to a control logic circuit coupled to the flip-flop.

Example 25 includes the method of example 23, wherein the transistor is a first transistor, the power converter includes a second transistor coupled to the first transistor, and further including in response to turning on the first transistor during the first low-side period, triggering a sampling window to sample the input, in response to the second control signal, triggering a hold window to compare the input to the threshold during the second low-side period, and in response to asserting the first logic signal during the second low-side period, asserting the second logic signal.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus adapted to be coupled to a power converter having an inductor, a high-side transistor, a low-side transistor and a switching node therebetween, the apparatus comprising:
    a first transistor having a gate terminal, a first current terminal, and a second current terminal, the first current terminal connected to the switching node;
    a capacitor coupled between the second current terminal and ground;
    a logic gate having a first logic gate input, a second logic gate input, and a logic gate output, the logic gate output coupled to the gate terminal;
    a comparator having a comparator input and a comparator output, the comparator input connected to the second current terminal;
    a multiplexer coupled to the comparator output;
    a first flip-flop coupled to the multiplexer and the second logic gate input; and
    a second flip-flop coupled to the multiplexer and the first flip-flop.

2. The apparatus of claim 1, wherein the logic gate is a first logic gate, the first flip-flop has a first flip-flop input, a second flip-flop input, and a flip-flop output, the multiplexer has a multiplexer selection input, the flip-flop output coupled to the second logic gate input and the multiplexer selection input, and further including a second logic gate having a third logic gate input and a second logic gate output, the third logic gate input coupled to the second logic gate input, the flip-flop output, and the multiplexer selection input, the second logic gate output coupled to the first flip-flop input.

3. The apparatus of claim 2, wherein the first logic gate is an AND logic gate, the first logic gate input is a non-inverted input, the second logic gate input is an inverted input, and the second logic gate is an inverter.

4. The apparatus of claim 1, wherein the multiplexer has a first multiplexer input, a second multiplexer input, a multiplexer selection input, and a multiplexer output, the second flip-flop has a first flip-flop input, a second flip-flop input, and a flip-flop output, the first flip-flop input coupled to the multiplexer output, the second flip-flop input coupled to the first flip-flop, the flip-flop output coupled to the second multiplexer input, and further including a control logic circuit having a control logic input and a control logic output, the control logic input coupled to the flip-flop output and the second multiplexer input, the control logic output coupled to the first flip-flop and the second flip-flop input.

5. The apparatus of claim 4, further including a driver circuit having a driver circuit input and a driver circuit output, the driver circuit input coupled to the control logic output, the driver circuit output coupled to the first logic gate input, the driver circuit output configured to be coupled to the low-side transistor.

6. An apparatus adapted to be coupled to a power converter having a high-side transistor, a low-side transistor and a switching node therebetween, the apparatus comprising:
    a control logic circuit configured to:
        generate a first control signal and a second control signal, the second control signal after the first control signal; and
        adjust a first operating mode of the power converter to a second operating mode of the power converter in response to an assertion of a first logic signal;
    a signal comparator circuit including a comparator, the signal comparator circuit coupled to the control logic circuit, the signal comparator circuit configured to:
        in response to the first control signal, sample an input of the comparator and assert a second logic signal in response to the input satisfying a threshold; and
        in response to the second control signal, assert the first logic signal; and
    wherein, the signal comparator circuit includes:
        a first transistor having a control terminal, a first current terminal and a second current terminal, the first current terminal connected to the switching node and the second current terminal is connected to an input of the comparator; and
        a capacitor connected between the second current terminal and ground.

7. The apparatus of claim 6, wherein the first operating mode is a pulse-width modulation (PWM) mode and the second operating mode is a pulse-frequency modulation (PFM) mode.

8. The apparatus of claim 6, wherein the power converter includes an inductor and
    the comparator is configured to compare the voltage at the input and assert the second logic signal in response to the inductor current being less than a current threshold.

9. The apparatus of claim 6, wherein the signal comparator circuit includes:
    a multiplexer coupled to the comparator output;
    a first flip-flop coupled to the multiplexer and the control logic circuit; and
    a second flip-flop coupled to the first flip-flop, the multiplexer, and the control logic circuit.

10. The apparatus of claim 9, wherein the control logic circuit has a control logic circuit input and a control logic circuit output, the multiplexer has a selection input, a first multiplexer input, a second multiplexer input, and a multiplexer output, the first flip-flop has a first flip-flop input, a first clock input, and a first flip-flop output, the second flip-flop has a second flip-flop input, a second clock input, and a second flip-flop output, and wherein:
    the first multiplexer input is coupled to the comparator output;
    the second multiplexer input is coupled to the second flip-flop output and the control logic circuit input;
    the multiplexer output is coupled to the second flip-flop input; and
    the first clock input is coupled to the second clock input and the control logic circuit output.

11. The apparatus of claim 9, further including:
    a control logic circuit having a control logic circuit input and a control logic circuit output, the control logic circuit input coupled to a flip-flop output of the second flip-flop, the control logic circuit output coupled to a first flip-flop input of the first flip-flop and a second flip-flop input of the second flip-flop; and
    a driver circuit having a driver circuit input, a first driver circuit output, and a second driver circuit output, the driver circuit input coupled to the control logic circuit output, the first driver circuit output adapted to be coupled to a gate terminal of the low-side transistor, the second driver circuit output adapted to be coupled to a gate terminal of the high-side transistor.

12. The apparatus of claim 9, wherein the low-side transistor has a first gate terminal, the first transistor has a second gate terminal, and the signal comparator circuit includes:
a first logic gate having a first logic gate input, a second logic gate input, and a first logic gate output, the first logic gate input coupled to the first gate terminal, the second logic gate input coupled to a first flip-flop output of the first flip-flop, the first logic gate output coupled to the second gate terminal; and
a second logic gate having a third logic gate input and a second logic gate output, the third logic gate input coupled to the second logic gate input and the first flip-flop output, the second logic gate output coupled to a first flip-flop input of the first flip-flop.

13. The apparatus of claim 9, wherein the threshold is a first threshold, the low-side transistor has a first gate terminal and the first transistor has a second gate terminal, and further including:
a logic gate having a logic gate output coupled to the second gate terminal, the logic gate configured to assert the second logic signal in response to the first control signal, the second logic signal to turn on the first transistor; and wherein
the multiplexer is configured to assert a third logic signal in response to the second logic signal being asserted and the first flip-flop asserting a fourth logic signal.

14. A power conversion system comprising:
a power converter having a high-side transistor, a low-side transistor and a switch node therebetween, the low-side transistor having a first gate terminal and having a first current terminal connected to the switch node;
a switch mode control circuit coupled to the first current terminal and the first gate terminal, the switch mode control circuit including a capacitor, a first transistor and a comparator, the switch mode control circuit configured to:
in response to a first control signal, sample an input of the comparator;
in response to the input satisfying a threshold, assert a first logic signal;
in response to a second control signal after the first control signal, assert a second logic signal in response to the assertion of the first logic signal; and
adjust a first operating mode of the power converter to a second operating mode of the power converter in response to the assertion of the second logic signal;
wherein, the first transistor has a second gate terminal, a second current terminal and a third current terminal, the second current terminal connected to the switch node, the third current terminal is connected to an input of the comparator and the capacitor is connected between the third current terminal and ground; and
wherein the comparator has a comparator output and the switch mode control circuit includes:
a multiplexer coupled to the comparator output;
a first flip-flop coupled to the multiplexer;
a control logic circuit coupled to the first flip-flop; and
a second flip-flop coupled to the first flip-flop, the multiplexer, and the control logic circuit.

15. The power conversion system of claim 14, wherein the power converter is a buck converter and the power converter further includes:
an inductor having a first inductor terminal connected to the switch node and a second inductor terminal connected to a load terminal.

16. The power conversion system of claim 14, wherein the first operating mode is a pulse-width modulation (PWM) mode and the second operating mode is a pulse-frequency modulation (PFM) mode.

17. The power conversion system of claim 14, wherein the power converter includes an inductor connected to the switch node and the high-side transistor includes a first high-side current terminal connected to the switch node and a second high-side current terminal connected to an input, and the comparator is configured to compare a voltage at the input and assert the first logic signal in response to a current through the inductor being less than a current threshold.

18. The power conversion system of claim 14, wherein the switch mode control circuit includes a driver circuit, a signal comparator circuit, and a control logic circuit, the driver circuit coupled to the signal comparator circuit and the control logic circuit, and wherein the driver circuit is configured to turn on the low-side transistor in response to the first control signal and the second control signal.

19. The power conversion system of claim 4, wherein the control logic circuit has a control logic circuit input and a control logic circuit output, the multiplexer has a selection input, a first multiplexer input, a second multiplexer input, and a multiplexer output, the first flip-flop has a first flip-flop input, a first clock input, and a first flip-flop output, the second flip-flop has a second flip-flop input, a second clock input, and a second flip-flop output, and wherein:
the first multiplexer input is coupled to the comparator output;
the second multiplexer input is coupled to the second flip-flop output and the control logic circuit input;
the multiplexer output is coupled to the second flip-flop input; and
the first clock input is coupled to the second clock input and the control logic circuit output.

20. The power conversion system of claim 4, wherein the switch mode control circuit includes:
a first logic gate having a first logic gate input, a second logic gate input, and a first logic gate output, the first logic gate input coupled to the first gate terminal, the second logic gate input coupled to a first flip-flop output of the first flip-flop, the first logic gate output coupled to the second gate terminal; and
a second logic gate having a third logic gate input and a second logic gate output, the third logic gate input coupled to the second logic gate input and the first flip-flop output, the second logic gate output coupled to a first flip-flop input of the first flip-flop.

21. The power conversion system of claim 4, wherein the threshold is a first threshold and further including:
a logic gate having a first logic gate input, a second logic gate input, and a logic gate output, the first logic gate input coupled to the first gate terminal, the second logic gate input coupled to a first flip-flop output of the first flip-flop, the logic gate output coupled to the second gate terminal, the logic gate configured to assert a third logic signal in response to a fourth logic signal being asserted and a fifth logic signal being de-asserted, the third logic signal to turn on the second transistor; and
wherein the multiplexer is configured to assert a sixth logic signal in response to the first logic signal being asserted and the first flip-flop asserting the fifth logic signal.

22. A method comprising:
in response to a first control signal, sampling an input of a comparator during a first low-side period, the input based on a voltage associated with a first transistor coupled to a power converter;
in response to the input satisfying a threshold, asserting a first logic signal;
in response to a second control signal after the first control signal, selecting, with a multiplexer, the first logic signal to be transmitted to a flip-flop during a second low-side period after the first low-side period;
asserting, with the flip-flop, a second logic signal based on the first logic signal;
adjusting a first operating mode of the power converter to a second operating mode of the power converter in response to the assertion of the second logic signal;
in response to turning on the first transistor during the first low-side period, triggering a sampling window to sample the input;
in response to the second control signal, triggering a hold window to compare the input to the threshold during the second low-side period; and
in response to asserting the first logic signal during the second low-side period, asserting the second logic signal.

23. A method comprising:
in response to a first control signal, sampling an input of a comparator during a first low-side period, the input based on a voltage associated with a first transistor coupled to a power converter;
in response to the input satisfying a threshold, asserting a first logic signal;
in response to a second control signal after the first control signal, selecting, with a multiplexer, the first logic signal to be transmitted to a flip-flop during a second low-side period after the first low-side period;
asserting, with the flip-flop, a second logic signal based on the first logic signal; and
adjusting a first operating mode of the power converter to a second operating mode of the power converter in response to the assertion of the second logic signal;
in response to turning on the first transistor during the first low-side period, asserting, with a logic gate coupled to the first transistor, a third logic signal to turn on a second transistor, the second transistor coupled to the first transistor and the logic gate;
in response to the assertion of the third logic signal and the input satisfying the threshold, asserting, with the comparator coupled to the second transistor, the first logic signal;
in response to the assertion of the first logic signal, asserting, with the multiplexer coupled to the comparator, a fourth logic signal to the flip-flop coupled to the multiplexer; and
in response to the second control signal, asserting, with the flip-flop, the second logic signal to a control logic circuit coupled to the flip-flop.

* * * * *